US012676506B2

(12) United States Patent
Kim et al.

(10) Patent No.: US 12,676,506 B2
(45) Date of Patent: Jul. 7, 2026

(54) ANTENNA AND ELECTRONIC DEVICE INCLUDING THE SAME

(71) Applicant: SAMSUNG ELECTRONICS CO., LTD., Suwon-si (KR)

(72) Inventors: Yongyoun Kim, Suwon-si (KR); Sungkoo Park, Suwon-si (KR); Jungchul An, Suwon-si (KR); Gun Lim, Suwon-si (KR); Hyunju Hong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 696 days.

(21) Appl. No.: 18/157,316

(22) Filed: Jan. 20, 2023

(65) Prior Publication Data

US 2023/0170739 A1    Jun. 1, 2023

Related U.S. Application Data

(63) Continuation of application No. PCT/KR2022/018998, filed on Nov. 28, 2022.

(30) Foreign Application Priority Data

Nov. 29, 2021    (KR) ........................ 10-2021-0167653
Mar. 8, 2022    (KR) ........................ 10-2022-0029324

(51) Int. Cl.
*H01M 10/46*    (2006.01)
*H02J 50/10*    (2016.01)
*H05K 9/00*    (2006.01)
(52) U.S. Cl.
CPC ............ *H02J 50/10* (2016.02); *H05K 9/0075* (2013.01)

(58) Field of Classification Search
CPC ........ H02J 7/0044; H02J 7/0042; H02J 50/10; H02J 50/005; H02J 50/12; H01Q 7/04; H01Q 7/06; H05K 9/0075
(Continued)

(56) References Cited

U.S. PATENT DOCUMENTS 10,673,131 B2    6/2020 Ahn et al.
10,893,368 B2    1/2021 Nikles et al.
(Continued)

FOREIGN PATENT DOCUMENTS

CN        109961942 A      7/2019
CN        110417128 A      11/2019
(Continued)

OTHER PUBLICATIONS

International Search Report and Written Opinion for International Application No. PCT/KR2022/018998; International Filing Date Nov. 28, 2022; Date of Mailing Mar. 2, 2023; 9 Pages.
(Continued)

*Primary Examiner* — Edward Tso
(74) *Attorney, Agent, or Firm* — CANTOR COLBURN LLP

(57)        ABSTRACT

An electronic device includes a first housing, a second housing, and a wireless charging antenna. The second housing is connected to the first housing such that the position thereof relative to the first housing is variable. The wireless charging antenna includes a shielding member and a reception coil alternately wound on a first surface of the shielding member and a second surface opposite to the first surface, and is disposed in at least one of the first housing and the second housing. A battery is electrically connected to the wireless charging antenna.

20 Claims, 22 Drawing Sheets

(58) Field of Classification Search
USPC ................................. 320/107, 108, 114, 115
See application file for complete search history.

(56)                        References Cited

U.S. PATENT DOCUMENTS

| | | | |
|---|---|---|---|
| 10,965,157 B2 | 3/2021 | Lee et al. | |
| 11,101,564 B2 | 8/2021 | Oh | |
| 2014/0125140 A1 | 5/2014 | Widmer et al. | |
| 2014/0159502 A1 | 6/2014 | Shimokawa et al. | |
| 2014/0354223 A1 | 12/2014 | Lee et al. | |
| 2018/0040950 A1 | 2/2018 | Lee et al. | |
| 2018/0248271 A1 | 8/2018 | Noh et al. | |
| 2019/0333694 A1 | 10/2019 | Ueta | |
| 2019/0372228 A1 | 12/2019 | Lee et al. | |
| 2020/0044484 A1* | 2/2020 | Lee | H02J 50/80 |
| 2020/0236826 A1 | 7/2020 | Baek et al. | |
| 2020/0328617 A1 | 10/2020 | Sherman et al. | |
| 2020/0373784 A1* | 11/2020 | Yun | H02J 50/005 |
| 2021/0142942 A1 | 5/2021 | Pei et al. | |
| 2021/0185843 A1 | 6/2021 | Lee et al. | |
| 2022/0149506 A1* | 5/2022 | Kim | G06F 1/1624 |

FOREIGN PATENT DOCUMENTS

| | | | |
|---|---|---|---|
| EP | 2752970 A1 | 7/2014 | |
| JP | 2008022469 A | 1/2008 | |
| JP | 6490585 B2 | 3/2019 | |
| KR | 101257676 B1 | 5/2013 | |
| KR | 20140146530 A | 12/2014 | |
| KR | 20160039327 A | 4/2016 | |
| KR | 20160142804 A | 12/2016 | |
| KR | 20170018646 A | 2/2017 | |
| KR | 20180015899 A | 2/2018 | |
| KR | 20190040642 A | 4/2019 | |
| KR | 20200014126 A | 2/2020 | |
| KR | 20200090476 A | 7/2020 | |
| KR | 20200133513 A | 11/2020 | |
| KR | 102194806 B1 | 12/2020 | |
| KR | 20210000999 A | 1/2021 | |
| KR | 20210075550 A | 6/2021 | |
| WO | 2018163170 A1 | 9/2018 | |

OTHER PUBLICATIONS

Extended European Search Report corresponding to Application No. 22899131.1-1002; Dated Dec. 12, 2024.
Korean Office Action for Korean Application No. 10-2022-0029324; Report Mail Date Feb. 21, 2026 (9 Pages—with English Translation).

\* cited by examiner

ANTENNA AND ELECTRONIC DEVICE INCLUDING THE SAME

CROSS-REFERENCE TO RELATED APPLICATIONS

This application is a continuation of International Application No. PCT/KR2022/018998 designating the United States, filed on Nov. 28, 2022, in the Korean Intellectual Property Receiving Office and claiming priority to Korean Patent Application No. 10-2021-0167653, filed on Nov. 29, 2021, in the Korean Intellectual Property Office, and Korean Patent Application No. 10-2022-0029324, filed on Mar. 8, 2022, in the Korean Intellectual Property Office, the disclosures of all of which are incorporated by reference herein in their entireties.

TECHNICAL FIELD

Various embodiments disclosed herein relate to an antenna and an electronic device including the same.

BACKGROUND ART

Electronic devices are capable of performing wireless charging or contactless charging by using wireless power transfer technology. The wireless power transfer technology may be a technology by which power is wirelessly transferred from a power transmission device to a power reception device without a connection between the power reception device and the power transmission device by a separate connector so that a battery of the power reception device is charged. The wireless power transfer technology may include a magnetic induction method and a magnetic resonance method, and may include various other types of wireless power transfer technology.

DISCLOSURE OF INVENTION

Technical Problem

In terms of wireless charging of a mobile electronic device, a charging efficiency can be increased by matching the size and shape of a transmission coil disposed in a wireless charger with the size and shape of a reception coil disposed in the electronic device. The charging efficiency can be further increased by aligning the center of the reception coil with the center of the transmission coil.

Recently, electronic devices have been developed to include different types of hardware designs beyond traditional bar-type devices such as rollable-type devices and foldable-type devices. Accordingly, there may be an insufficient space for mounting a reception coil having the same form as a standardized transmission coil, in various types of electronic devices.

In addition, it may be difficult to align the center of a reception coil with the center of an electronic device due to the change in device design, e.g., the shape or profile of rollable-type and/or foldable-type devices. Users understand that it is common to place a terminal on the center of a wireless charger, and thus, when a user places the wireless charger on the center of the electronic device, the charging efficiency may be reduced due to the shape and/or profile of the device.

Solution to Problem

Various non-limiting embodiments described herein provide a reception coil which may be disposed in an electronic device that have a shape or profile that can be changed according to various forms. In one or more non-limiting embodiments, an electronic device may be changed into different shapes or profiles (e.g., using a rollable-type design and/or foldable-type design) while disposing the reception coil in the electronic device such that the center thereof is adjacent to the center of the electronic device.

According to a non-limiting embodiment, an electronic device includes a first housing, a second housing connected to the first housing such that the position thereof relative to the first housing is variable, a wireless charging antenna which includes a shielding member and a reception coil alternately wound on a first surface of the shielding member and a second surface opposite to the first surface, the wireless charging antenna being disposed in at least one of the first housing and the second housing, and a battery electrically connected to the wireless charging antenna.

According to various embodiments disclosed herein, a wireless charging antenna, which is included an electronic device including a first housing and a second housing slidably coupled to each other and is disposed in at least one of the first housing and the second housing, may include a shielding member and a reception coil alternately wound on a first surface of the shielding member and a second surface opposite to the first surface.

Advantageous Effects of Invention

The reception coil according to various embodiments disclosed herein may be disposed in an electronic device which can have a variable form facilitated, for example, using a rollable or foldable electronic device.

The reception coil may be disposed in the electronic device such that the center thereof is adjacent to or aligned with the center of the electronic device. Therefore, when the user places a wireless charger on the center of the electronic device, the center of the reception coil may be aligned with or adjacent to the center of a transmission coil of the wireless charger, and thus the electronic device may ensure the charging efficiency of a predetermined level or higher.

BRIEF DESCRIPTION OF DRAWINGS

In describing the drawings, identical or similar reference numerals may be used to denote identical or similar elements.

MODE FOR THE INVENTION

Figure 1:
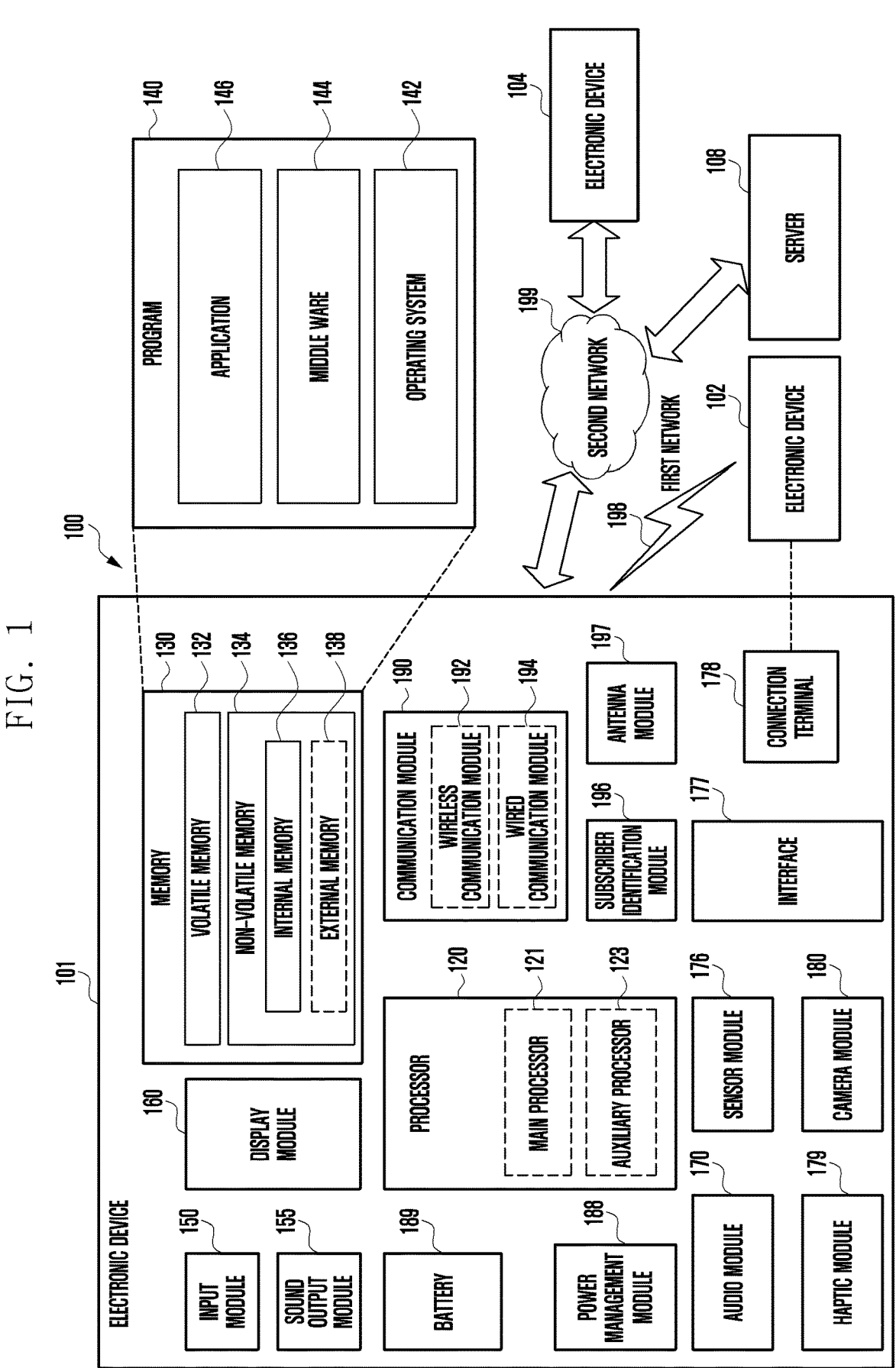
FIG. 1 is a block diagram of an electronic device in a network environment according to various embodiments.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
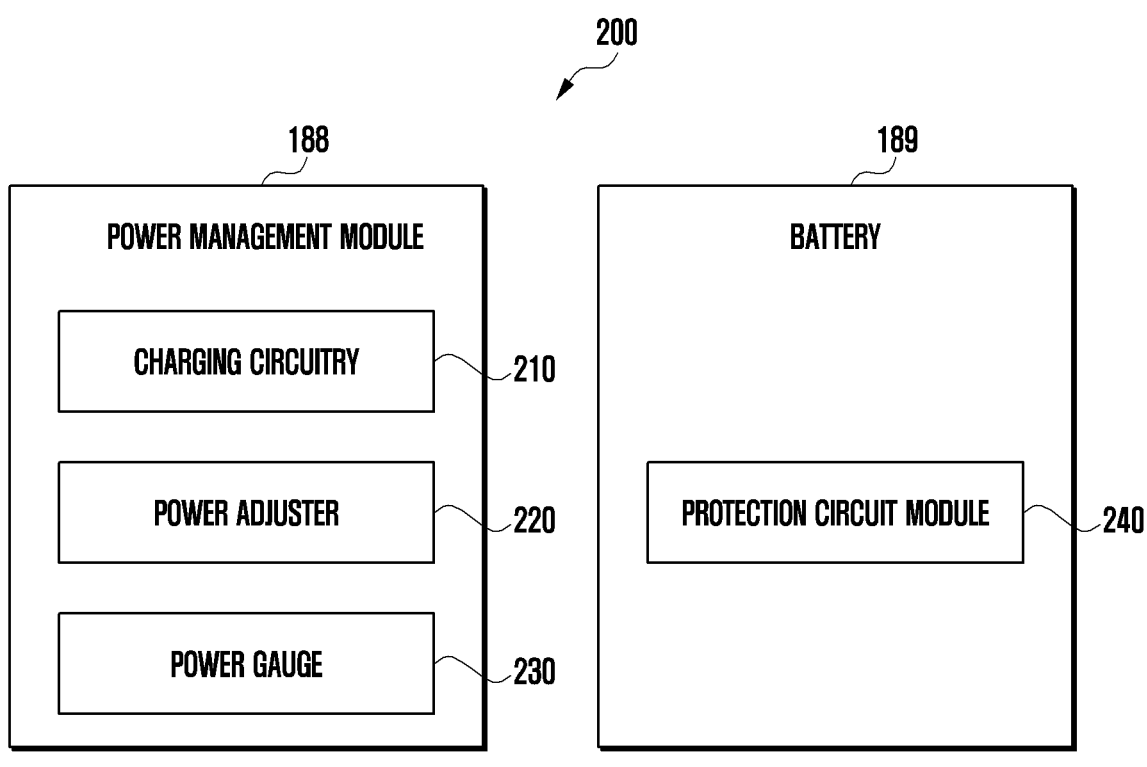
FIG. 2 is a block diagram of a power management module and a battery according to various embodiments.

FIG. 2 is a block diagram 200 illustrating the power management module 188 and the battery 189 according to various embodiments. Referring to FIG. 2, the power management module 188 may include charging circuitry 210, a power adjuster 220, or a power gauge 230. The charging circuitry 210 may charge the battery 189 by using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator. The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

Figure 3:
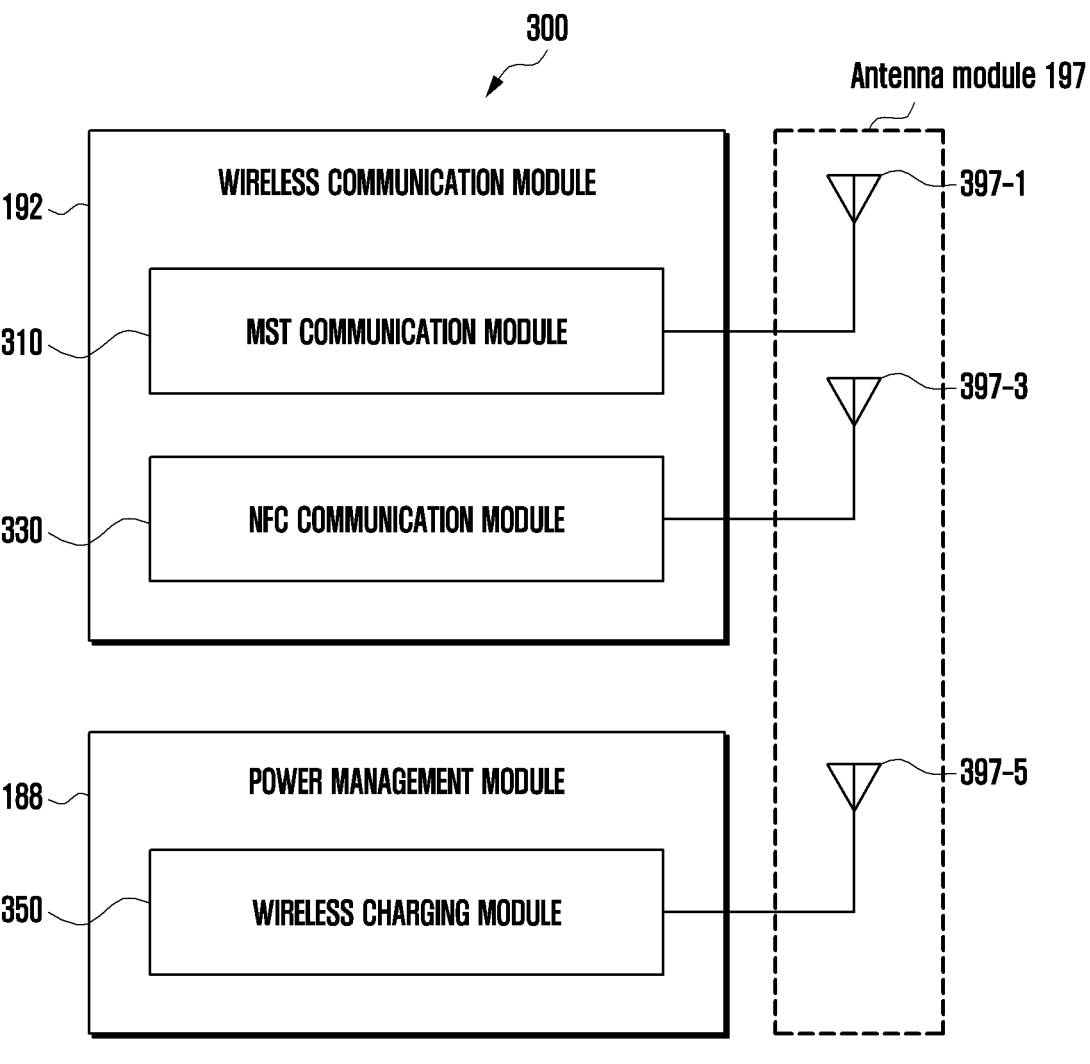
FIG. 3 is a block diagram of a wireless communication module, a power management module, and an antenna module of an electronic device according to various embodiments.

FIG. 3 is a block diagram 300 illustrating the wireless communication module 192, the power management module 188, and the antenna module 197 of the electronic device 101 according to various embodiments. Referring to FIG. 3, the wireless communication module 192 may include a magnetic secure transmission (MST) communication module 310 or a near-field communication (NFC) module 330, and the power management module 188 may include a wireless charging module 350. In such a case, the antenna module 197 may include a plurality of antennas that include a MST antenna 397-1 connected with the MST communication module 310, a NFC antenna 397-3 connected with the NFC communication module 330, and a wireless charging antenna 397-5 connected with the wireless charging module 350. For ease of description, the same components as those described in regard to FIG. 1 are briefly described or omitted from the description.

The MST communication module 310 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 397-1. To generate the magnetic signal, according to an embodiment, the MST communication module 310 may include a switching module (not shown) that includes one or more switches connected with the MST antenna 397-1, and control the switching module to change the direction of voltage or current supplied to the MST antenna 397-1 according to the received signal. The change of the direction of the voltage or current allows the direction of the magnetic signal (e.g., a magnetic field) emitted from the MST antenna 397-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to an embodiment, for example, payment-related information and a control signal that are received by the electronic device 102 in the form of the magnetic signal may be further transmitted to an external server 108 (e.g., a payment server) via the network 199.

The NFC communication module 330 may obtain a signal containing control information or payment information such as card information from the processor 120 and transmit the obtained signal to the external electronic device 102 via the NFC antenna 397-3. According to an embodiment, the NFC communication module 330 may receive such a signal transmitted from the external electronic device 102 via the NFC antenna 397-3.

The wireless charging module 350 may wirelessly transmit power to the external electronic device 102 (e.g., a cellular phone or wearable device) via the wireless charging antenna 397-5, or wirelessly receive power from the external electronic device 102 (e.g., a wireless charging device). The wireless charging module 350 may support one or more of various wireless charging schemes including, for example, a magnetic resonance scheme or a magnetic induction scheme.

According to an embodiment, some of the MST antenna 397-1, the NFC antenna 397-3, or the wireless charging antenna 397-5 may share at least part of their radiators. For example, the radiator of the MST antenna 397-1 may be used as the radiator of the NFC antenna 397-3 or the wireless charging antenna 397-5, or vice versa. In such a case, the antenna module 197 may include a switching circuit (not shown) adapted to selectively connect (e.g., close) or disconnect (e.g., open) at least part of the antennas 397-1, 397-3, or 397-5, for example, under the control of the wireless communication module 192 (e.g., the MST communication module 310 or the NFC communication module 330) or the power management module (e.g., the wireless charging module 350). For example, when the electronic device 101 uses a wireless charging function, the NFC communication module 330 or the wireless charging module 350 may control the switching circuit to temporarily disconnect at least one portion of the radiators shared by the NFC antenna 397-3 and the wireless charging antenna 397-5 from the NFC antenna 397-3 and to connect the at least one portion of the radiators with the wireless charging antenna 397-5.

According to an embodiment, at least one function of the MST communication module 310, the NFC communication module 330, or the wireless charging module 350 may be controlled by an external processor (e.g., the processor 120). According to an embodiment, at least one specified function (e.g., a payment function) of the MST communication module 310 or the NFC communication module 330 may be performed in a trusted execution environment (TEE). According to an embodiment, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE. Hereinafter, identical reference numerals will be used for all identical or similar elements, except where otherwise indicated.

Figure 4A:
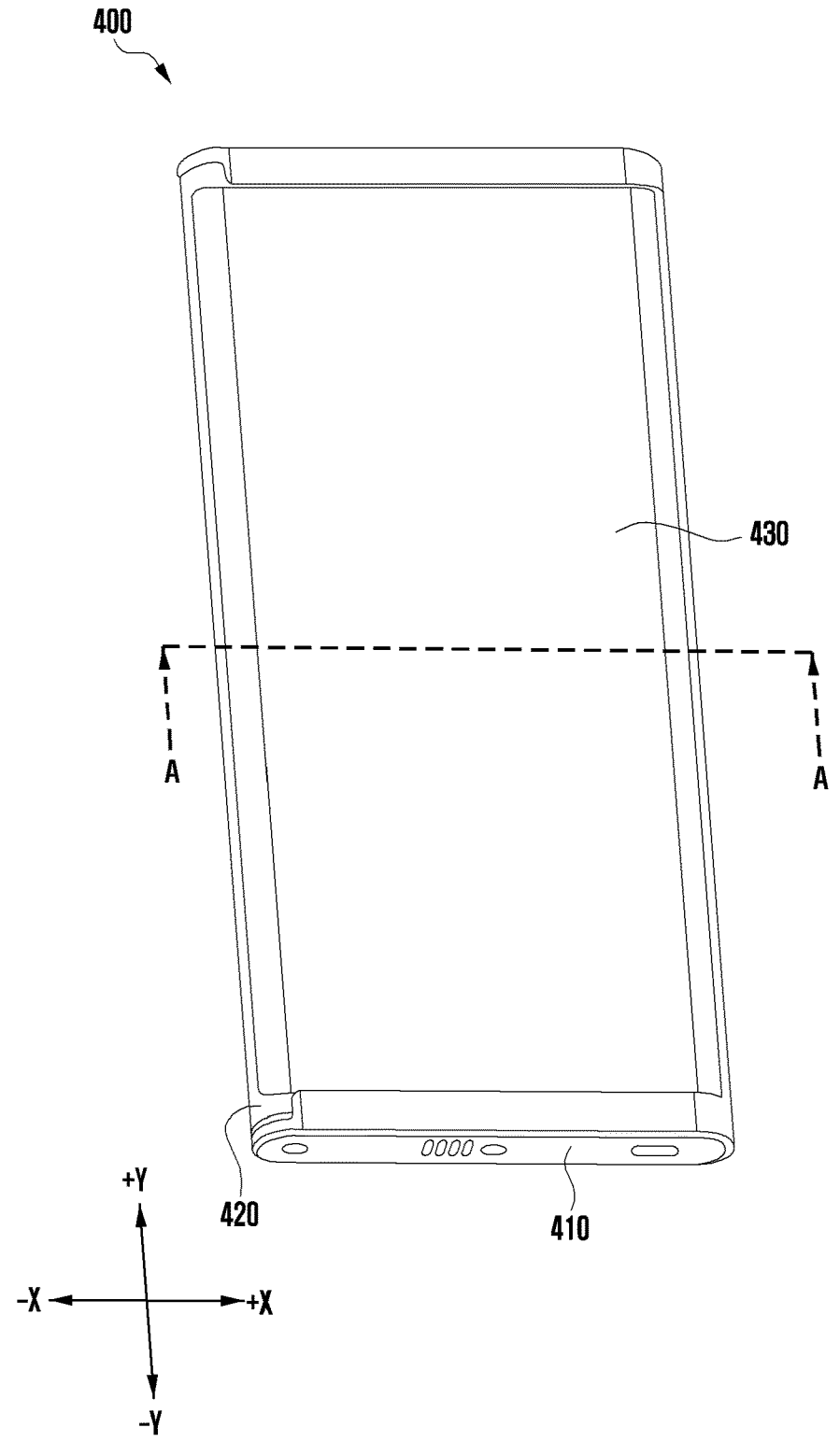
FIG. 4A is a perspective view of an electronic device according to various embodiments disclosed herein, which is in a closed state.
Figure 4B:
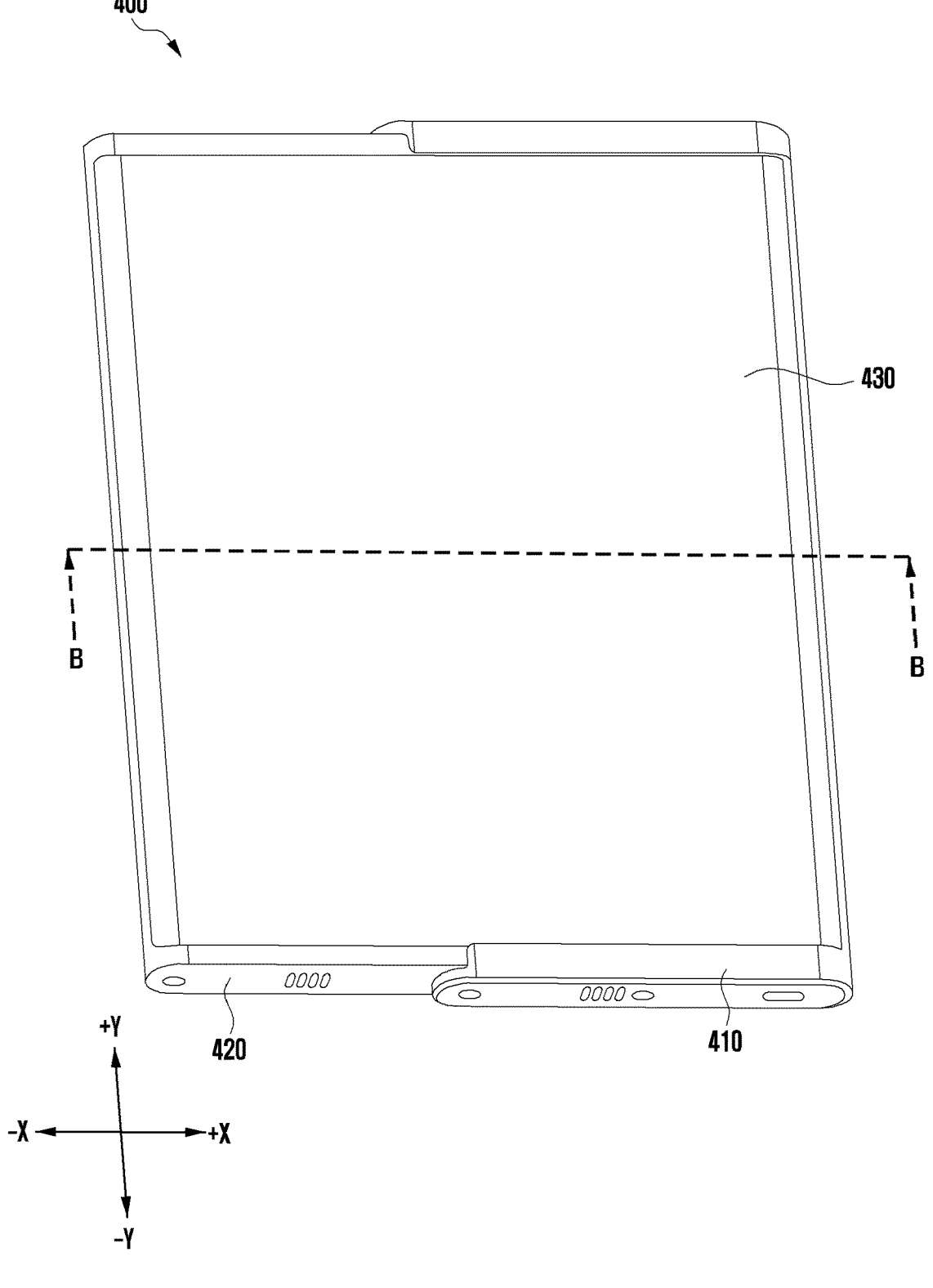
FIG. 4B is a perspective view of an electronic device according to various embodiments disclosed herein, which is in an opened state.
Figure 4C:
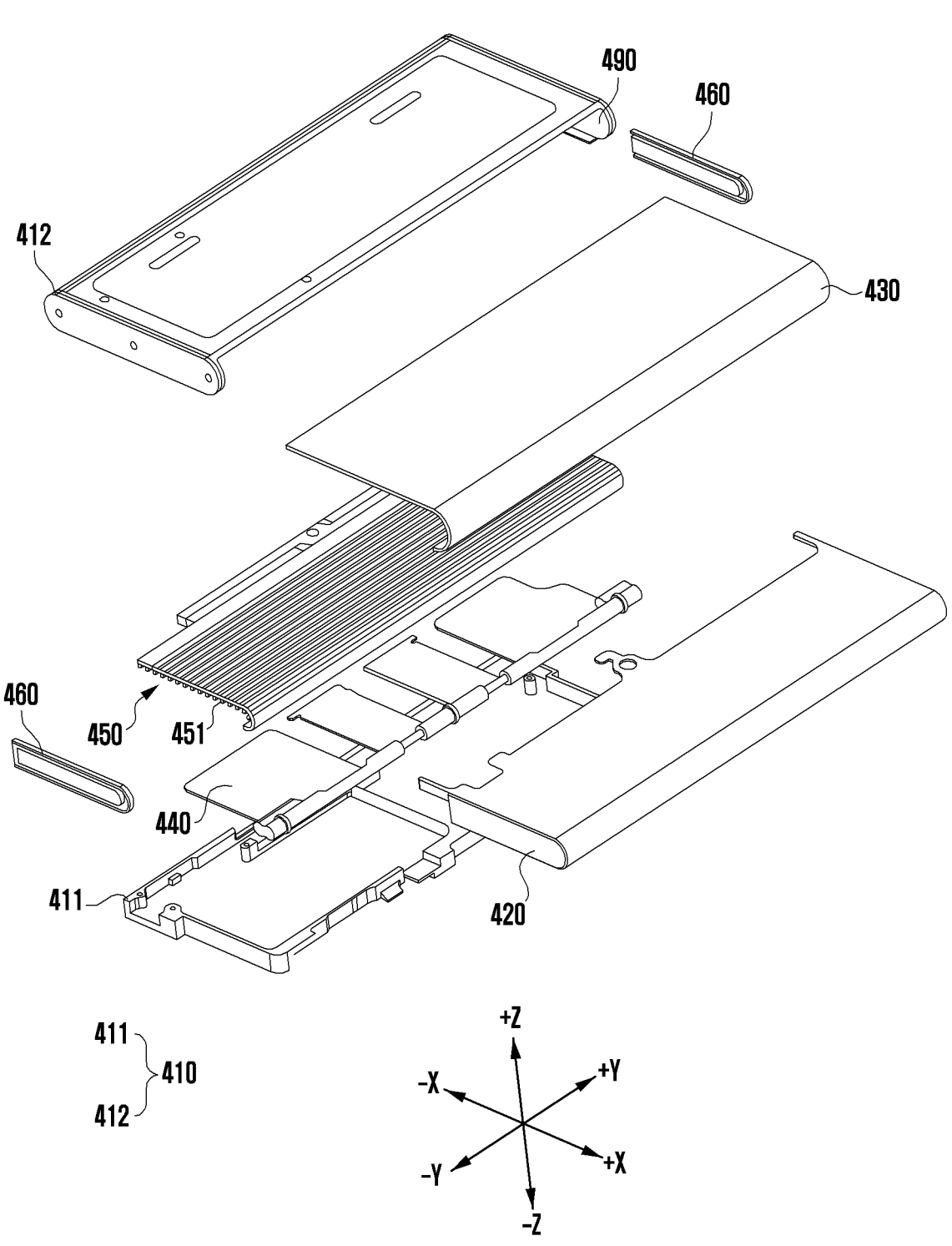
FIG. 4C is an exploded perspective view of an electronic device according to various embodiments disclosed herein.

FIG. 4A is a perspective view of an electronic device according to various embodiments disclosed herein, which is in a closed state. FIG. 4B is a perspective view of an electronic device according to various embodiments disclosed herein, which is in an opened state. FIG. 4C is an exploded perspective view of an electronic device according to various embodiments disclosed herein.

According to various embodiments, an electronic device 400 illustrated in FIGS. 4A to 4C may be electronic devices 101 illustrated in FIG. 1. The electronic device described below may include at least one of the elements described with reference to FIG. 1.

Referring to FIGS. 4A and 4B, the electronic device 400 may be the electronic device 400 configured to be slidable. In a non-limiting embodiment, the sliding operation of the electronic device 400 may allow for sliding of a second housing 420 with respect to a first housing 410. The second housing 420 may slide with respect to the first housing 410 in the +X direction with reference to FIGS. 4A and 4B or in the −X direction with reference to FIGS. 4A and 4B. In the following description, the sliding operation of the second housing 420 in the +X direction is defined as slide-in, and the sliding operation of the second housing 420 in the −X direction is defined as slide-out.

The electronic device 400 according to various embodiments disclosed herein may be the electronic device 400 implemented such that the area of a flexible display module 430 exposed to the outside of the electronic device 400 is increased or decreased through sliding. In other words, the electronic device 400 may be an electronic device configured such that a part of the flexible display module 430 is inserted into the electronic device 400 or withdrawn from the inside of the electronic device 400 through sliding.

According to various embodiments, the flexible display module 430 may be the flexible display module 430 capable of being bent or deformed. In an embodiment, the flexible display module 430 may include a substrate made of a flexible material. For example, the flexible display module 430 may include a substrate formed of a flexible polymer material such as polyimide (PI) or polyethylene terephthalate (PET). In addition, the flexible display module 430 may include a substrate made of a very thin glass material. The flexible display module 430 may be supported by a support member 450, and the area thereof, which is a part visible to the outside, may be increased or decreased by the sliding of the second housing 420 with respect to the first housing 410. In an embodiment, the flexible display module 430 may further include a touch sensing circuit (e.g., a touch sensor). In addition, the flexible display module 430 may be coupled to or disposed adjacent to a pressure sensor capable of measuring the intensity (pressure) of a touch and/or a digitizer that detects a magnetic field type pen input device (e.g., a stylus pen). For example, the digitizer may include a coil member disposed on a dielectric substrate so as to detect an electromagnetic induction resonance frequency applied from a pen input device.

According to various embodiments, the electronic device 400 may be switched from a closed state (e.g., the state illustrated in FIG. 4A) to an open state (e.g., the state illustrated in FIG. 4B) by a sliding operation.

The closed state may imply a state in which the second housing 420 has fully slid in. The closed state may imply that the second housing 420 has reached a position where the same can no longer slide in. In the closed state, one end of the first housing 410 and one end of the second housing 420 may substantially are aligned with each other. For example, as illustrated in FIG. 4A, the second housing 420 may not protrude from the first housing 410, or the first housing 410 may not protrude from the second housing 420.

The opened state may imply a state in which the second housing 420 has fully slid out. The opened state may imply a state in which the second housing 420 has reached a position where the second housing 420 cannot slide out any more. The area of the flexible display module 430 exposed to the outside may be larger in the opened state than in the closed state.

According to an embodiment, the sliding of the second housing 420 with respect to the first housing 410 can be performed in a semi-automatic manner. For example, the sliding of the second housing 420 with respect to the first housing 410 can be performed by a member (not shown) which provides an elastic force in the sliding direction. In this case, when the sliding of the second housing 420 with respect to the first housing 410 is partially performed, the sliding of the second housing 420 may be performed by an elastic force provided to the first housing 410 and/or the second housing 420.

According to a non-limiting embodiment, the sliding of the second housing 420 with respect to the first housing 410 may be performed in an automatic manner. For example, the second housing 420 may slide with respect to the first housing 410 by means of a motor (not shown). The motor that causes the second housing 420 to slide may be operated according to signals input through various buttons and sensors included in the electronic device 400.

According to various embodiments, the first housing 410 may include multiple housings. Since the second housing 420 slides with respect to the first housing 410, the second housing 420 may be understood to slide with respect to the multiple housings included in the first housing 410. The multiple housings included in the first housing 410 may include, for example, a front housing 411 forming a part of the front surface (e.g., the surface facing the +Z direction in FIG. 4A) of the electronic device 400 and a rear housing 412 forming a part of the rear surface (e.g., the surface facing the −Z direction in FIG. 4A) of the electronic device 400. A rear cover (not shown) may be coupled to the rear housing 412. The rear cover may be formed of a transparent, opaque, or translucent material. A part of the second housing 420 may be received in a space formed by the multiple housings included in the first housing 410. The elements of the first housing 410 illustrated in FIG. 4C are merely examples. Therefore, the first housing 410 may be formed as one housing, and may include more housings than those illustrated in FIG. 4C.

According to various embodiments, the second housing 420 may slide with respect the first housing 410. Referring to FIGS. 4A and 4C, a part of the second housing 420 may be inserted into a sliding groove 490 of the first housing 410 so that the sliding of the second housing 420 can be guided. A support housing 440 may be coupled to the second housing 420. The support housing 440 may be a housing supporting the support member 450 supporting the flexible display module 430. A receiving space (e.g., a receiving space 480 in FIGS. 5A and 5B) may be formed between the support housing 440 and the second housing 420 by coupling the support housing 440 and the second housing 420. By sliding of the second housing 420, a part of the flexible display module 430 may be received in the receiving space 480 provided between the second housing 420 and the support housing 440. In an embodiment, the second housing 420 and the support housing 440 may be integrally formed.

According to various embodiments, the support member 450 may support a part of the flexible display module 430. The support member 450 may include a flexible or bendable structure. For example, the support member 450 may include a structure in which multiple bars 451 extending in a direction (e.g., the Y-axis direction of FIG. 4C) perpendicular to a sliding direction (e.g., the X-axis direction of FIG. 4C) are arranged along the sliding direction. In addition, the support member 450 may be configured with various bendable structures that can be bent. For example, the support member 450 may be a bendable plate, and may have a structure in which multiple grooves are formed to allow bending.

According to various embodiments, the support member 450 may slide with sliding of the second housing 420, and may support the flexible display module 430. The sliding of the support member 450 may be guided by guide rails 460. For example, the sliding of the support member 450 may be guided by inserting both ends of each of the multiple bars 451 included in the support member 450 into the guide rails 460, respectively. The guide rails 460 guiding the support member 450 may be coupled to the second housing 420. For example, as illustrated in FIG. 4C, the guide rails 460 may be coupled to both ends of the second housing 420, and the support member 450 may be disposed between the guide rails 460.

Figure 5A:
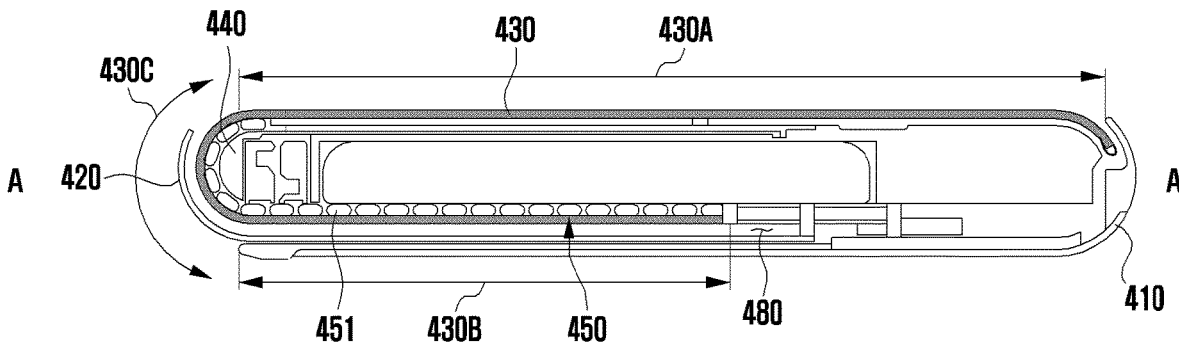
FIG. 5A is a cross-sectional view, taken along line A-A, of the electronic device illustrated in FIG. 4A according to various embodiments disclosed herein.
Figure 5A:
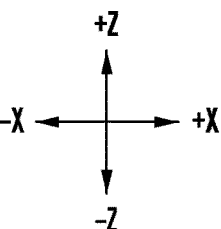
Figure 5B:
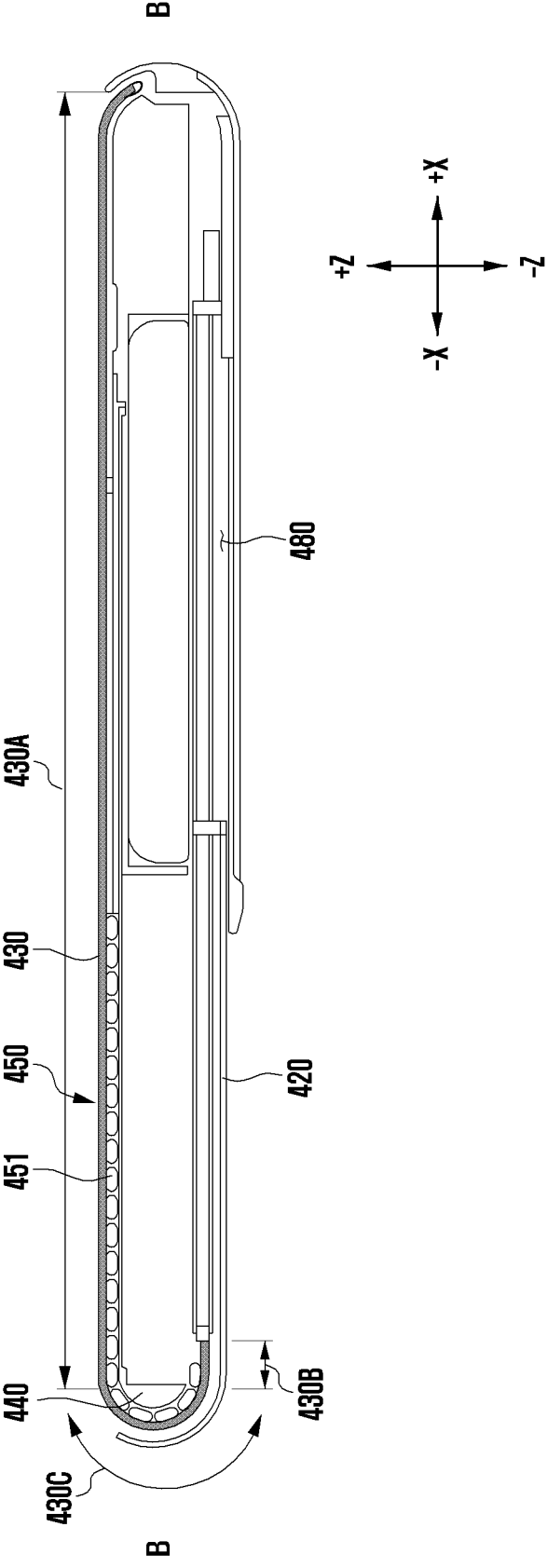
FIG. 5B is a cross-sectional view, taken along line B-B, of the electronic device illustrated in FIG. 4B according to various embodiments disclosed herein.

FIG. 5A is a cross-sectional view, taken along line A-A, of the electronic device illustrated in FIG. 4A according to various embodiments disclosed herein. FIG. 5B is a cross-sectional view, taken along line B-B, of the electronic device illustrated in FIG. 4B according to various embodiments disclosed herein.

According to various embodiments, the flexible display module 430 may include multiple areas. The multiple areas described below may be areas distinguished based on the state of the flexible display module 430 in the electronic device 400 or a part in which the flexible display module 430 is positioned. For example, the flexible display module 430 may include a first area 430A, in which the flexible display module 430 is exposed to the outside of the electronic device 400, a second area 430B, in which the flexible display module 430 is received in the receiving space 480 of the electronic device 400, and a third area 430C that connects the first area 430A to the second area 430B and is deformed (e.g., bent). In an embodiment, the second area 430B of the flexible display module 430 may be an area in which a part of the flexible display module 430 is received in the receiving space 480. The receiving space 480 may be a space surrounded by various elements constituting the electronic device 400. In an embodiment, the receiving space 480 may include an area formed by the second housing 420 and a support housing (e.g., the support housing 440 in FIG. 4C). In an embodiment, depending on the shape of the housing surrounding the flexible display module 430, a part of the third area 430C may also be visible from the outside of the electronic device 400. For example, as illustrated in FIGS. 5A and 5B, a part of the second housing 420 may cover a bending area. Accordingly, a part of the third area 430C that is not covered by the second housing 420 may also be exposed to the outside of the electronic device 400. The above-described areas of the flexible display module 430 are merely distinguished for convenience of description, and may not be visually distinct areas.

In an embodiment, the third area 430C may be an area in which a part of the flexible display module 430 is deformed to correspond to the outer shape of the second housing 420. For example, as illustrated in FIGS. 5A and 5B, a part of the outer shape of the second housing 420 may include a round shape. The third area 430C may be an area in which a part of the flexible display module 430 is bent to correspond to the round shape of the second housing 420.

In an embodiment, the flexible display module 430 may be supported by the support member 450. The sliding of the support member 450 may be guided by the guide rails 460. The guide rails 460 may be formed to correspond to the round shape of the second housing 420 so that the support member 450 can support the third area 430C, and the support member 450 may be bent along the guide rails 460 corresponding to the round shape. For example, when the support member 450 includes the multi-bar 451, in a part supporting the third area 430C, the gap between the multi-bars 451 may be wider than in a part supporting the first area 430A or the second area 430B of the flexible display module 430, and the support member 450 may be bent as a whole. The support member 450 may support the third area 430C of the flexible display module 430 while being bent along the guide rails 460.

The sizes of the first area 430A and the second area 430B may be changed depending on sliding of the electronic device 400. For example, the size of the first area 430A in a closed state (e.g., the state illustrated in FIG. 4A) may be smaller than the size of the first area 430A in an opened state (e.g., the state illustrated in FIG. 4B). The size of the second area 430B in the closed state may be greater than the size of the second area 430B in the opened state.

According to various embodiments, when the second housing 420 slides out, the flexible display module 430 supported by the support member 450 may slide so that the first area 430A is increased and the second area 430B is decreased.

According to various embodiments, When the second housing 420 slides in, the flexible display module 430 supported by the support member 450 may slide so that the first area 430A is decreased and the second area 430B is increased.

As described above, in the electronic device 400 according to various embodiments disclosed herein, a part of the flexible display module 430 may be inserted into the receiving space 480 or withdrawn from the receiving space 480, and the area of the flexible display module 430 visible from the outside of the electronic device 400 may be increased or decreased. When the area of the flexible display module 430 visible from the outside is changed, various operations, such as adjusting the amount of information displayed or adjusting the aspect ratio of a content displayed, may be performed.

Figure 6:
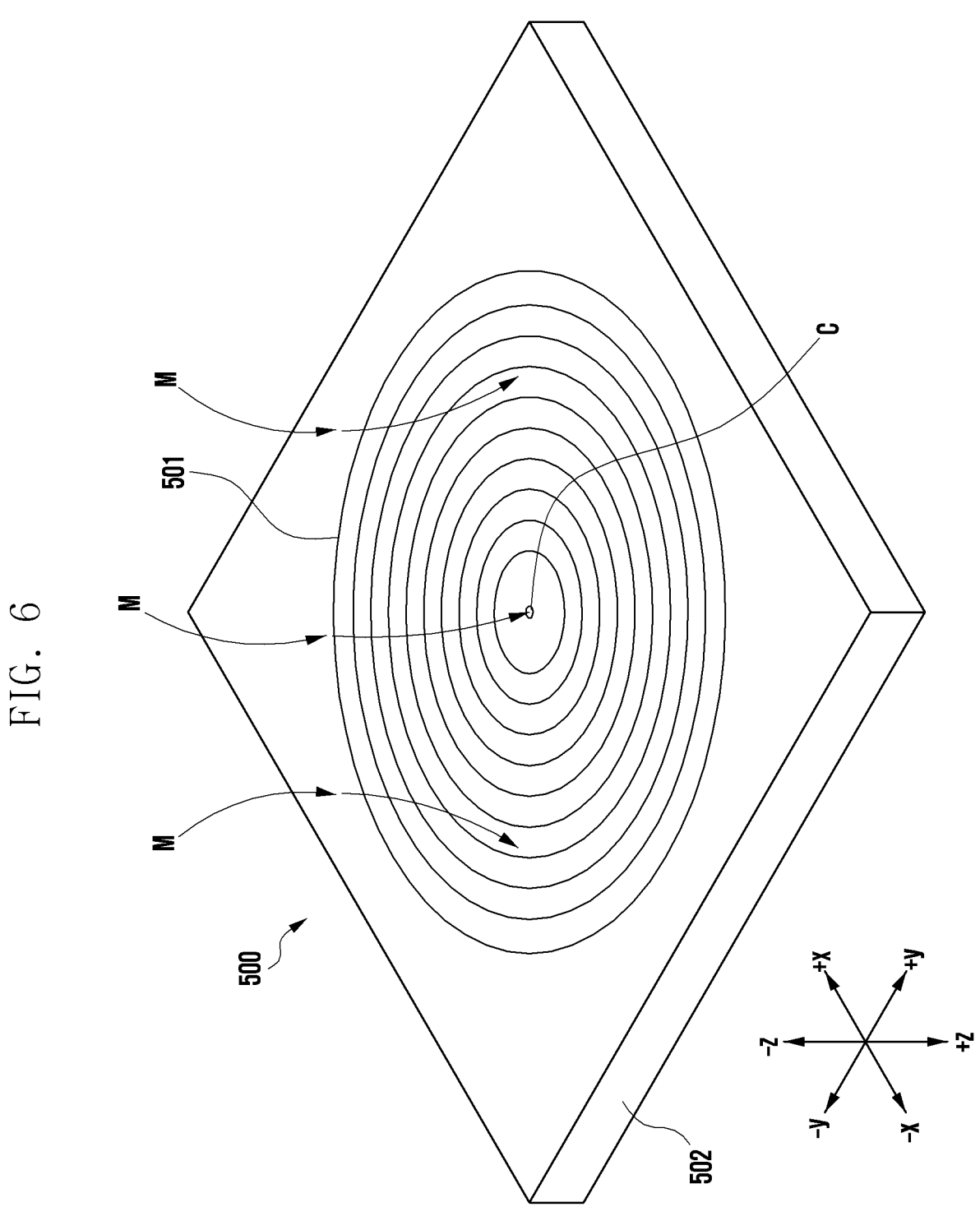
FIG. 6 illustrates a wireless charging antenna according to a comparative embodiment.

FIG. 6 illustrates a wireless charging antenna according to a comparative embodiment.

Before describing various embodiments disclosed herein, a brief description will be made of a wireless charging antenna 500 according to a comparative embodiment and a wireless charging method for the electronic device 400 (e.g., the electronic device 101 in FIG. 1) using the wireless charging antenna 500.

The wireless charging antenna 500 in the comparative embodiment connected to the battery 189 of the electronic device 400 may be disposed in the electronic device 400. As illustrated in FIG. 6, the wireless charging antenna 500 of the comparative embodiment may include a reception coil 501, in which a current is generated by a magnetic field generated in a transmission coil of an external electronic device (e.g., mobile phone, external charging device) (e.g., the electronic device 102 of FIG. 1), and a shielding member 502 for shielding noise generated by the electromagnetic force and/or operating frequency of the external electronic device.

In the reception coil 501 of the comparative embodiment, an induced current may be generated by a magnetic field M generated from the external electronic device (e.g., the electronic device 102 in FIG. 1), and power may be supplied to the battery 189 through the induced current. For example, when power is supplied to the external electronic device, a current flows in a transmission coil (not shown) disposed in the external electronic device to generate a magnetic field M. The magnetic field M generated in the external electronic device may generate an induced current in the reception coil 501 disposed in the electronic device 400, and the battery 189 connected to the reception coil 501 may be charged through the induced current. In addition, the wireless charging antenna 500 may supply power to the battery 189 through various types of electromagnetic interaction with the external electronic device. For example, the wireless charging antenna 500 may support at least one of various types of wireless charging including magnetic resonance or magnetic induction.

As the shape of the reception coil 501 of the wireless charging antenna 500 matches the shape of the transmission coil of the external electronic device, the wireless charging efficiency of the electronic device 400 may increase. In addition, in the electronic device 400, the charging efficiency may increase as the magnetic field M generated in the transmission coil passes through the winding center (C) of the reception coil 501.

The reception coil 501 of the wireless charging antenna 500 may be formed to correspond to the transmission coil of the external electronic device. Referring to FIG. 6, for example, the reception coil 501 of the wireless charging antenna 500 may be formed to be wound multiple times in the form of a concentric circle around the reception coil winding center (C) so as to correspond to the shape of the transmission coil of the external electronic device. For example, the reception coil 501 of the wireless charging antenna 500 may be wound so as to match the innermost pattern and the outermost pattern of the transmission coil of the external electronic device match each other. In summary, in the electronic device 400, the winding center (C) of the reception coil 501 of the wireless charging antenna 500 may be aligned with the winding center of the transmission coil disposed in the external electronic device, and when the reception coil 501 is formed in a shape corresponding to the transmission coil, the charging efficiency may increase.

However, in the electronic device 400 of the rollable type illustrated in FIGS. 4A to 5B, a space for mounting the wireless charging antenna 500 may not be secured. Referring to FIGS. 5A and 5B, a display module (e.g., the display module 430 in FIG. 4A) may be inserted into the receiving space 480 in the electronic device 400 by sliding of the first housing 410 and the second housing 420. When the reception coil 501 is disposed inside the above-mentioned electronic device 400, the display module 430 may overlap the reception coil 501 in the Z-axis direction with reference to FIG. 5A. When the display module 430 is positioned between the wireless charging antenna 500 of the electronic device 400 and the external electronic device, electricity/magnetism exchange between the reception coil 501 of the wireless charging antenna 500 and the transmission coil of the external electronic device may not be smoothly performed. Therefore, the wireless charging efficiency of the electronic device 400 may be reduced.

Furthermore, when the wireless charging antenna 500 of the comparative embodiment shown in FIG. 6 is disposed in the electronic device 400 which changes in form, like the electronic device 400 shown in FIGS. 4A to 5B, the center part of the electronic device 400 may not be aligned with the center of the reception coil 501. In this case, if a user positions the external electronic device on the center part of the electronic device 400 (e.g., the center part P in FIG. 9C), the center part of the electronic device 400 may not be aligned with the winding center of the reception coil 501. In this case, the magnetic field M generated in the transmission coil may not be concentrated at the winding center (C) of the reception coil 501 of the wireless charging antenna 500 disposed inside the electronic device 400. Therefore, less induced current by the magnetic field M of the transmission coil is generated in the reception coil 501 than when the winding center (C) of the reception coil 501 is aligned with the winding center of the transmission coil of the external electronic device, and thus the charging efficiency of the electronic device 400 may be reduced.

Various embodiments disclosed herein may present a wireless charging antenna 600 capable of being disposed in the electronic device 400 which changes in form, like the electronic device 400 illustrated in FIG. 4A to 5B. Furthermore, a method for securing wireless charging efficiency in the electronic device 400, the shape of which is changed, by using the wireless charging antenna 600 may be presented. Hereinafter, a detailed description thereof will be made.

Figure 7A:
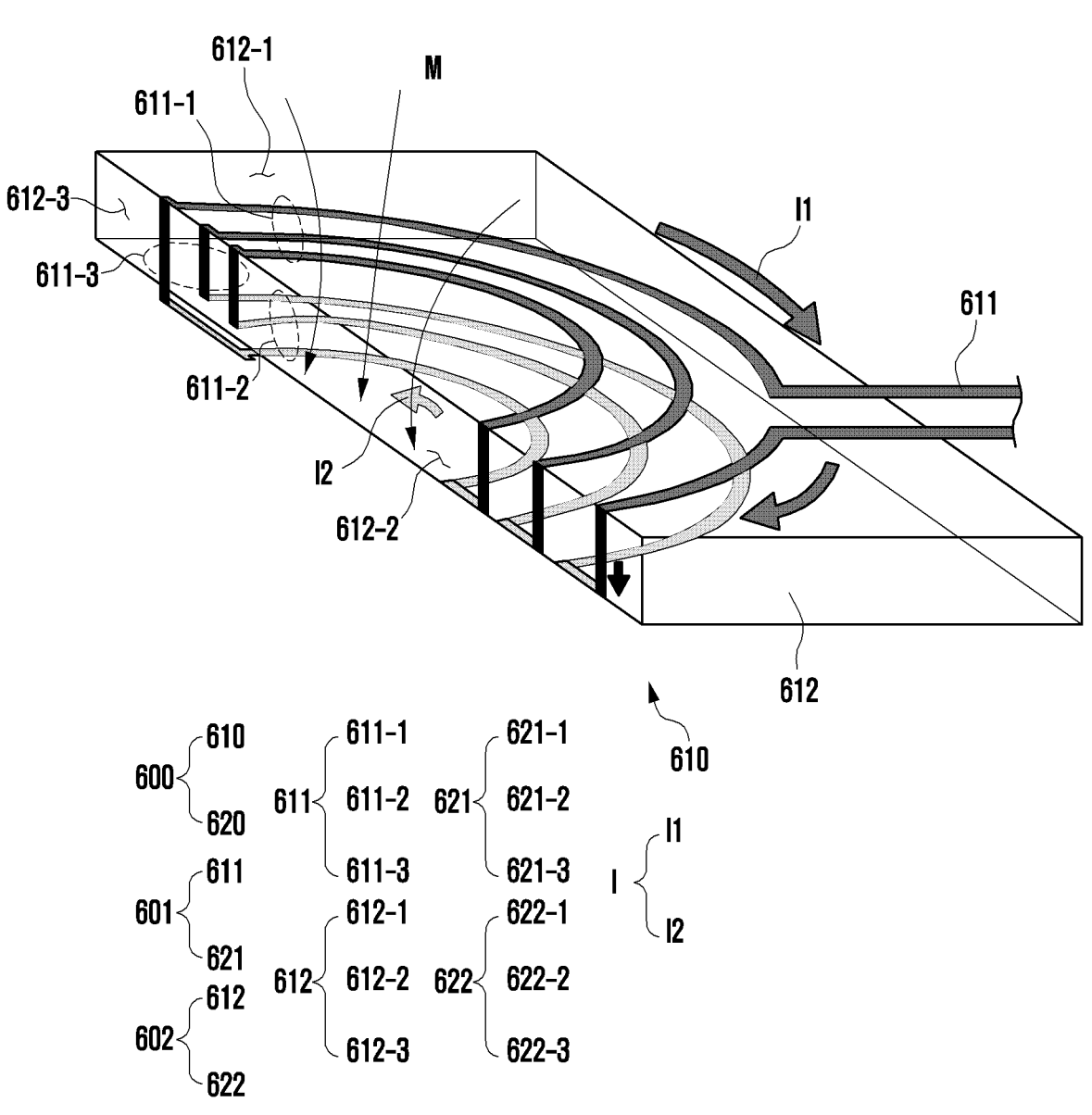
FIG. 7A illustrates a wireless charging antenna according to various embodiments disclosed herein and the direction of an induced current induced to the wireless charging antenna.
Figure 7B:
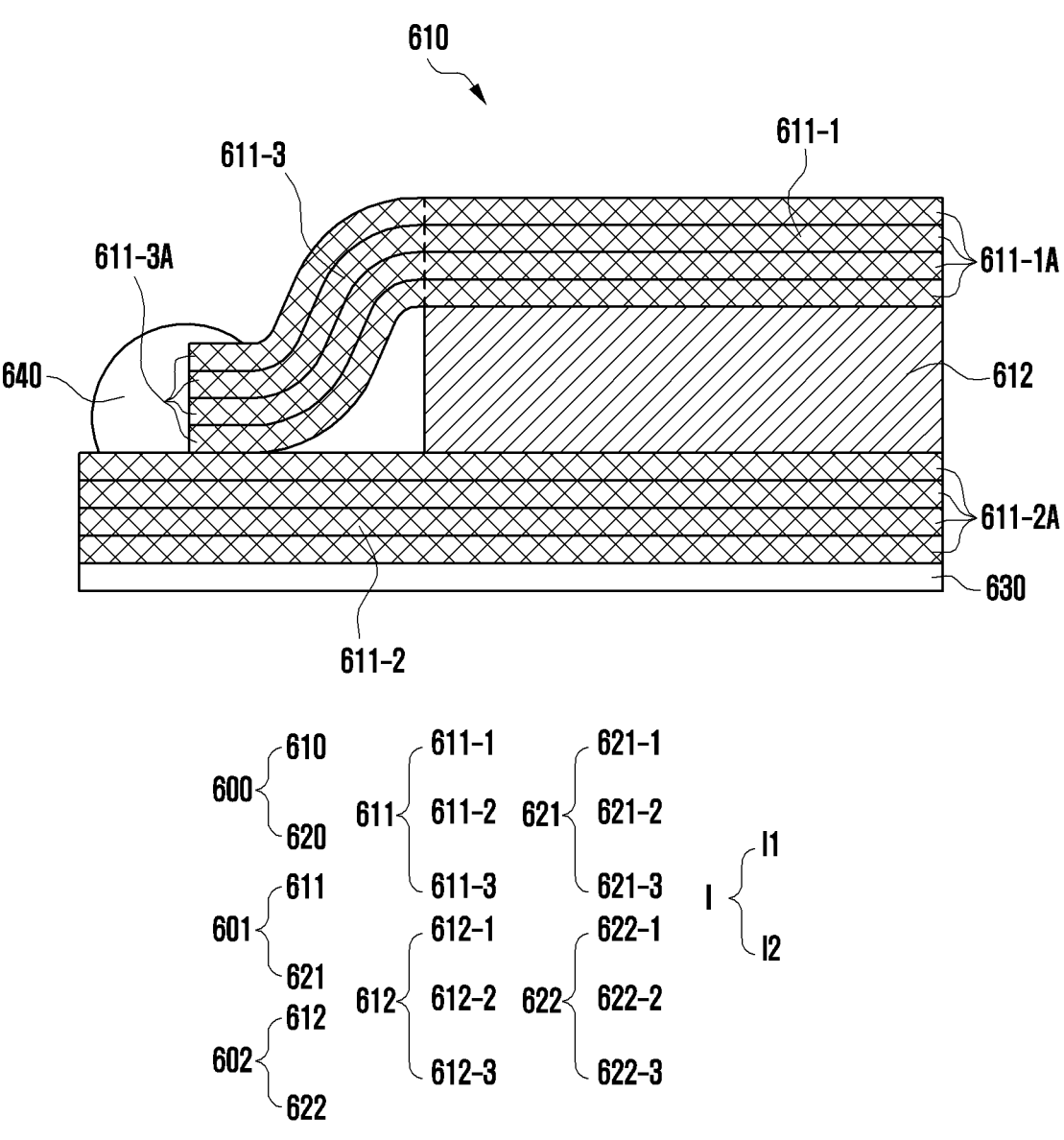
FIG. 7B illustrates a structure in which a first area and a second area of a wireless charging antenna is connected to each other in an embodiment.
Figure 7C:
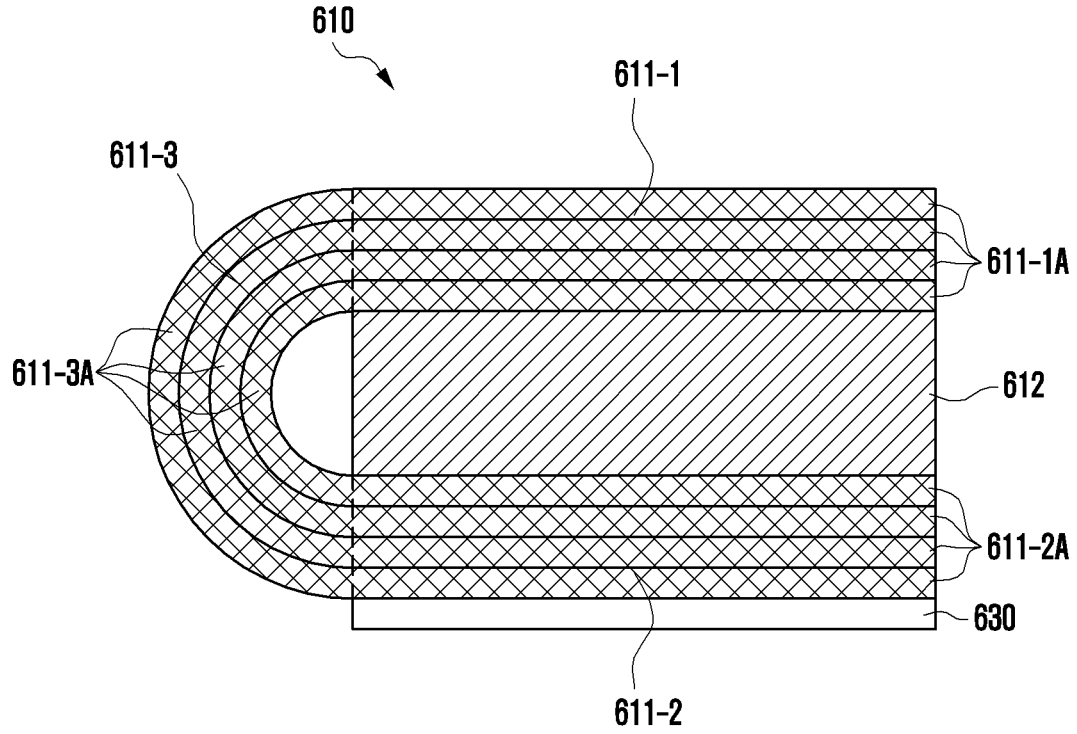
FIG. 7C illustrates a structure in which a first area and a second area of a wireless charging antenna is connected to each other in another embodiment.
Figure 8:
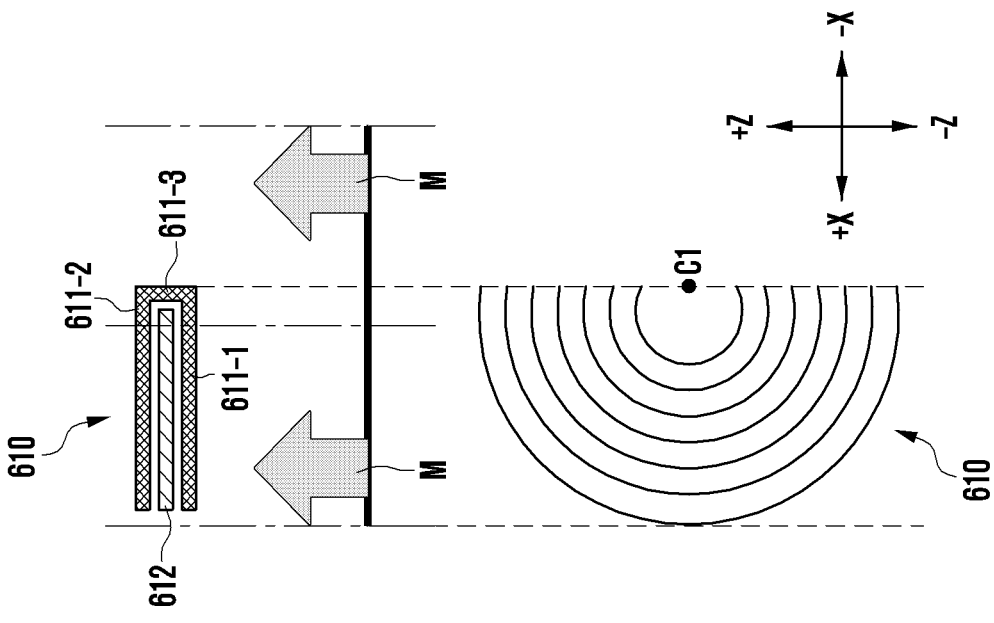
FIG. 8 is a view used to describe the wireless charging efficiency of an electronic device based on the degree of folding of a wireless charging antenna according to various embodiments disclosed herein.
Figure 8:
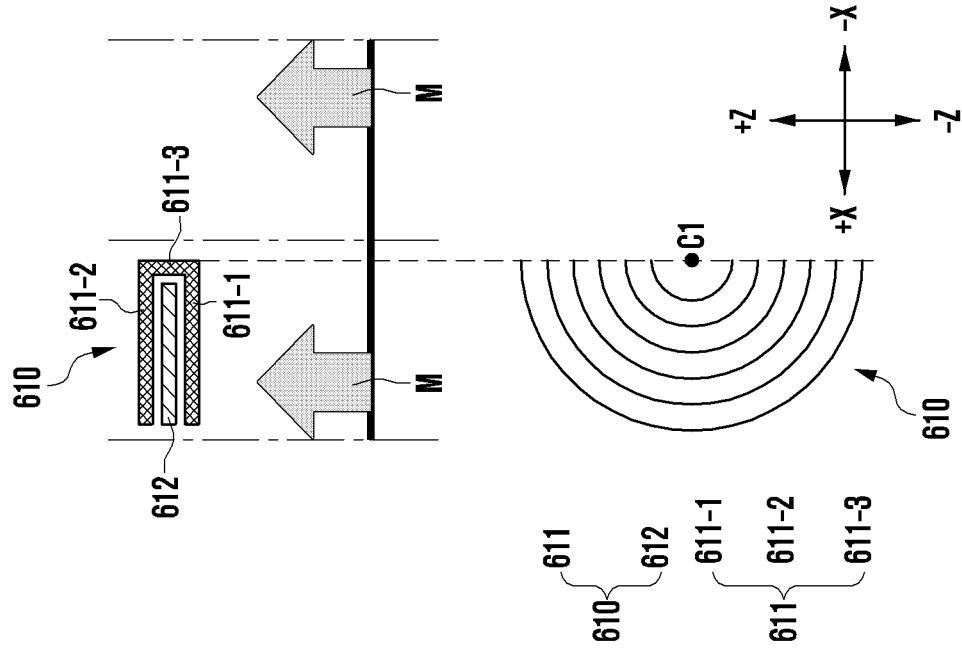

FIG. 7A illustrates a wireless charging antenna according to various embodiments disclosed herein and the direction of an induced current induced to the wireless charging antenna. FIG. 7B illustrates a structure in which a first area and a second area of a wireless charging antenna is connected to each other in an embodiment. FIG. 7C illustrates a structure in which a first area and a second area of a wireless charging antenna is connected to each other in another embodiment. FIG. 8 is a view used to describe the wireless charging efficiency of an electronic device based on the degree of folding of a wireless charging antenna according to various embodiments disclosed herein.

According to various embodiments disclosed herein, the electronic device 400 may include a first housing 410 and a second housing 420 connected with the first housing 410 such that the position thereof relative to the first housing 410 is variable. For example, as illustrated in FIGS. 4A to 5B, the first housing 410 and the second housing 420 may be slidably coupled to each other.

According to various embodiments, the wireless charging antenna 600 may be disposed in at least one of the first housing 410 and the second housing 420. The wireless charging antenna 600 may include a first wireless charging antenna 610 and a second wireless charging antenna 620. In an embodiment, the first wireless charging antenna 610 may be disposed in the first housing 410, and the second wireless charging antenna 620 may be disposed in the second housing 420. In an embodiment, only one of the first wireless charging antenna 610 and the second wireless charging antenna 620 may be disposed in the electronic device 400. For example, referring to FIG. 8 to be described later, only the first wireless charging antenna 610 may be disposed in the electronic device 400.

Hereinafter, in describing the first wireless charging antenna 610 and the second wireless charging antenna 620, the description will be made using the wireless charging antenna 600. The wireless charging antenna 600 may include a reception coil 601 and a shielding member 602. The reception coil 601 of the wireless charging antenna 600 may include a first reception coil 611 of the first wireless charging antenna 610 and a second reception coil 621 of the second wireless charging antenna 620. The shielding member 602 of the wireless charging antenna 600 may include a first shielding member 612 of the first wireless charging antenna 610 and a second shield member 622 of the second wireless charging antenna 620.

Furthermore, the second wireless charging antenna 620 is an element corresponding to the first wireless charging antenna 610, and in the following description, a description of "the first wireless charging antenna 610" may be equally applied to "the second wireless charging antenna 620".

According to various embodiments, the wireless charging antenna 600 may transmit and receive power to and from a transmission coil of an external electronic device (e.g., the electronic device 102 in FIG. 1) in a frequency band corresponding to the wireless power consortium (WPC) standard. In an embodiment, an induced current may be generated in the reception coil 601 of the wireless charging antenna 600 by a magnetic field M generated from an external electronic device (e.g., a mobile phone or an external charging device). For example, when power is supplied to an external electronic device, a magnetic field M may be generated in a transmitting coil of the external electronic device. The reception coil 601 of the wireless charging antenna 600 forms an induced current such that an induced magnetic field that opposes a change in the magnetic field M of the external electronic device can be formed. The wireless charging antenna 600 may supply power to the battery 189 through the induced current. The battery 189 may store the power received from the wireless charging antenna 600, and may supply necessary power to the electronic device 400.

According to various embodiments, the shielding member 602 of the wireless charging antenna 600 may shield noise generated by the electromagnetic force and/or operating frequency of the wireless charging antenna 600. In an embodiment, the shielding member 602 may shield the magnetic field M generated in the transmission coil of the external electronic device so that the magnetic field M generated in the transmission coil does not affect electronic components disposed in the electronic device 400. For example, the shielding member 602 may be disposed between the transmission coil of the external electronic device and the battery 189 of the electronic device 400. Therefore, in order to prevent the magnetic field M generated in the transmission coil from affecting the battery 189 of the electronic device 400, the magnetic field M flowing toward the battery 189 of the electronic device 400 may be shielded. Furthermore, Since the magnetic field M generated in the transmission coil does not pass through the shielding member 602, a closed loop may be formed between the transmission coil of the external electronic device and the reception coil 601 disposed on the shielding member 602. Therefore, electromagnetic interaction between the transmission coil of the external electronic device and the reception coil 601 of the wireless charging antenna 600 may be smoothly performed.

Figure 9A:
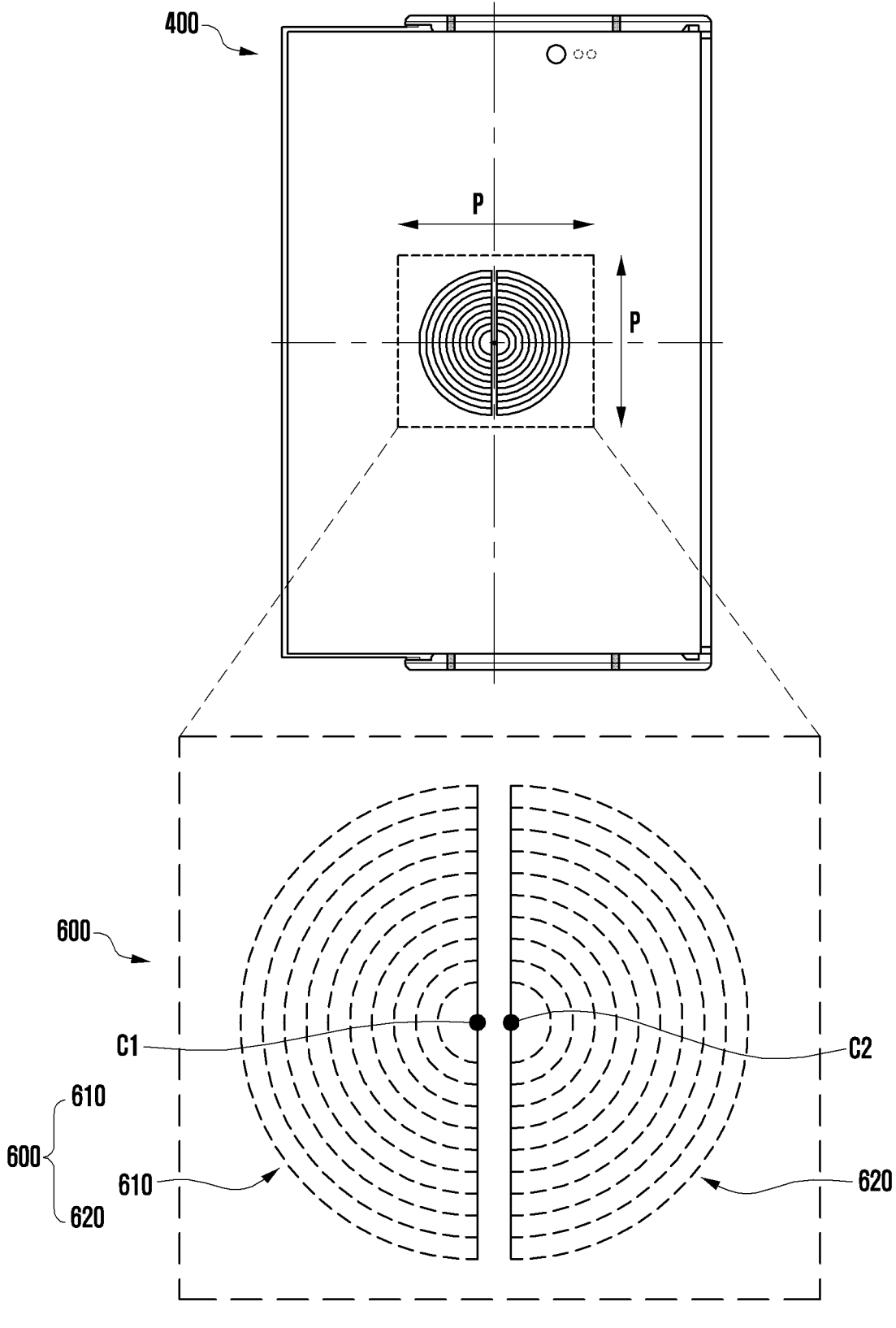
FIG. 9A illustrates a state in which one pattern formed by a first wireless charging antenna and a second wireless charging antenna according to various embodiments disclosed herein is positioned at the center part of an electronic device.
Figure 9B:
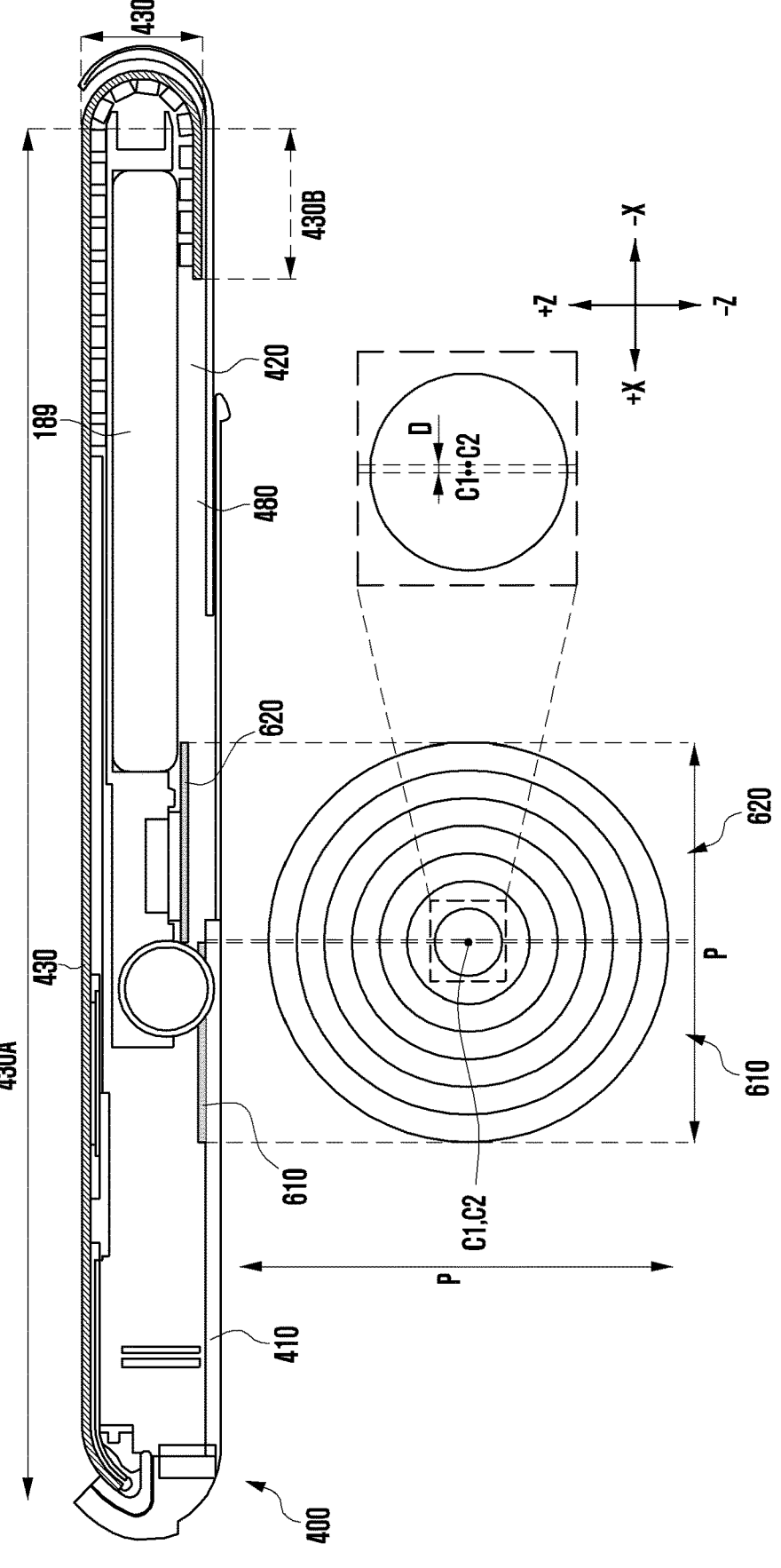
FIG. 9B illustrates the position relationship between a first wireless charging antenna and a second wireless charging antenna while an electronic device according to various embodiments disclosed herein is in a slide-out state.

According to various embodiments, the magnet member (not shown) may be disposed in the electronic device 400. In an embodiment, the magnet member may be shaped to surround the wireless charging antenna 600. Referring to FIGS. 9A and 9B, when the transmission coil disposed in the external electronic device is positioned within a wireless charging range P in which the reception coil 601 of the wireless charging antenna 600 is disposed, the electronic device 400 may be wirelessly charged by the external electronic device. The wireless charging range P may imply an area in which the reception coil 601 is disposed in the electronic device 400, and in an embodiment, may imply the center part of the electronic device 400. The position of a magnet disposed in the external electronic device and the position the magnet member disposed in the electronic device 400 are fixed. For example, the position of the magnet disposed in the external electronic device may be fixed in the external electronic device such that the magnet surrounds the transmission coil, and the position of the magnet member of the electronic device 400 may be fixed in the electronic device 400 such that the magnet member surrounds the wireless charging antenna 600 including the reception coil 601. When the external electronic device approaches the electronic device 400, an attractive force may occur between the magnet of the external electronic device and the magnet member disposed in the electronic device 400. The magnet, the position of which is fixed in the external electronic device, and the magnet member, the position of which is fixed in the electronic device 400, may have positions relative to each other fixed by the attractive force. Therefore, the relative positions of the reception coil 601 of the wireless charging antenna 600, disposed in the electronic device 400, and the transmission coil of the external electronic device may also be fixed. For example, the positions of the transmission coil of the external electronic device and the reception coil 601 of the electronic device 400 may be fixed such that the transmission coil and the reception coil 601 face each other. As the transmitting coil disposed in the external electronic device is positioned within the wireless charging range P of the electronic device 400, the electromagnetic induction phenomenon may smoothly occur between the transmitting coil of the external electronic device and the reception coil 601 of the electronic device 400. Therefore, the electronic device 400 may be wirelessly charged by the external electronic device.

According to various embodiments, as illustrated in FIG. 7A, the first wireless charging antenna 610 may have a form in which the first reception coil 611, the first shielding member 612, and the first reception coil 611 are stacked in order. The first reception coil 611 of the first wireless charging antenna 610 may include a first section 611-1 disposed on a first surface 612-1 of the first shielding member 612, a second section 611-2 disposed on a second surface 612-2 opposite the first surface of the first shielding member 612, and a third section 611-3 disposed on a third surface 612-3 positioned between the first surface 612-1 and the second surface 612-2 of the first shielding member 612. The first surface 612-1 of the first shielding member 612 may be a surface facing a cover member 520 of the electronic device 400 (e.g., a surface facing the −Z direction with reference to FIG. 5A), and the second surface 612-2 of the first shielding member 612 may be a surface facing the display module 430 of the electronic device 400 (e.g., a surface facing the +Z direction with reference to FIG. 5A). According to one or more non-limiting embodiments, the wireless charging antenna 610 wraps around the shielding member 612 such that the first section 611-1 is disposed on first surface 612-1 and the second section 611-2 is disposed on the second section 612-2.

Figure 10A:
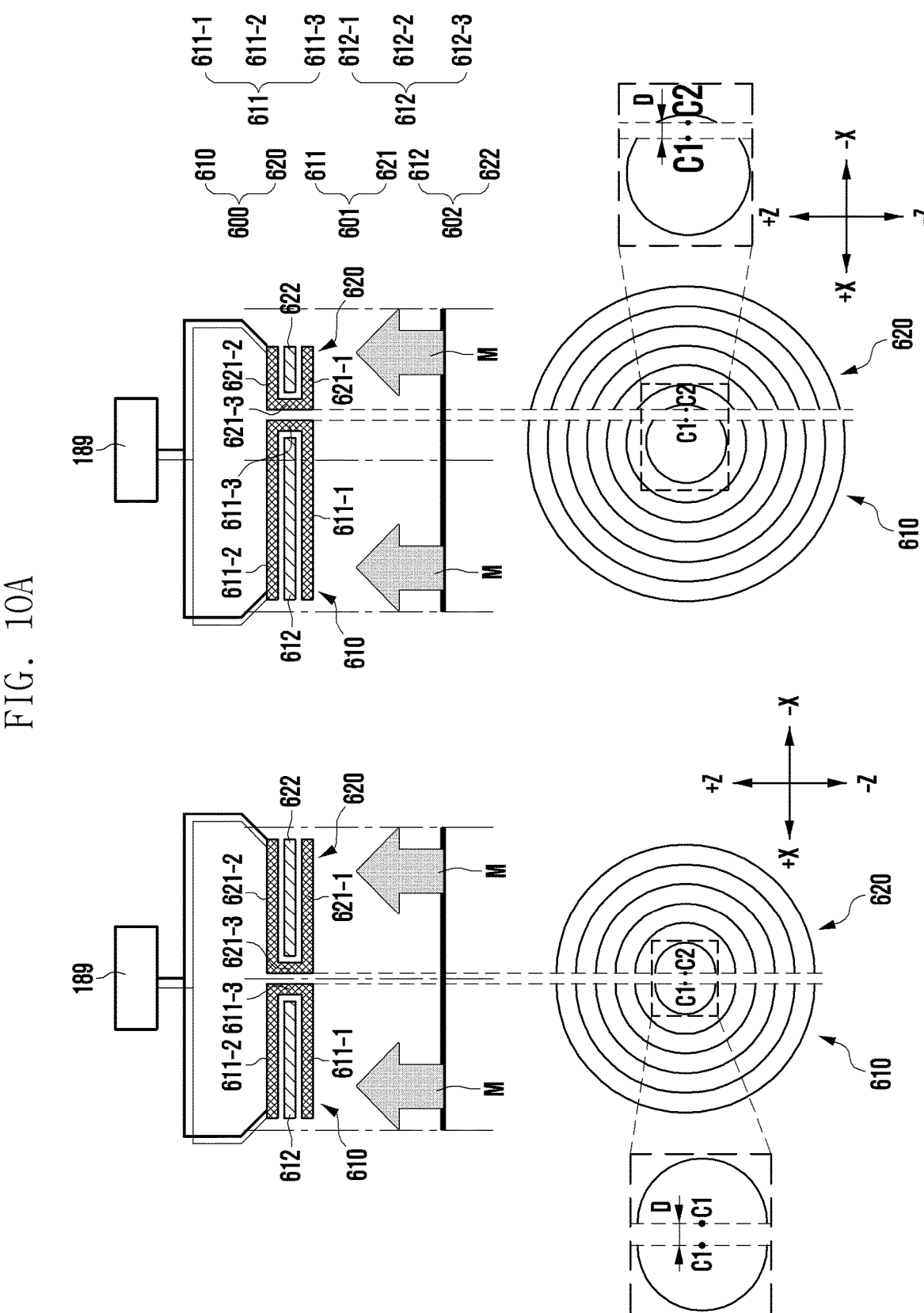
FIG. 10A is a view used to describe the wireless charging efficiency of an electronic device according to various embodiments disclosed herein when a first wireless charging antenna and a second wireless charging antenna are arranged in the electronic device.

Referring to FIG. 10A which will be described later, as described above, the second wireless charging antenna 620 may have the same structure as the first wireless charging antenna 610. For example, the second wireless charging antenna 620 may have a structure in which the second reception coil 621, the second shielding member 622, and the second reception coil 621 are stacked in order. Furthermore, a first section 621-1 of the second reception coil 621 may be disposed on a first surface 622-1 of the second shielding member 622, a second section 621-2 may be disposed on a second surface 622-2 of the second shielding member 622, and a third section 621-3 may be disposed on a third surface 622-3 of the second shielding member 622. The first surface 622-1 of the second shielding member 622 may be a surface facing the cover member 520 of the electronic device 400 (e.g., a surface facing the −Z direction with reference to FIG. 5A), the second surface 622-2 of the second shielding member 622 may be a surface facing the display module 430 of the electronic device 400 (e.g., a surface facing the +Z direction with reference to FIG. 5A), and the third surface 622-3 may be a surface positioned between the first surface 622-1 and the second surface 622-2.

According to various embodiments, referring to FIGS. 7B and 7C, the first wireless charging antenna 610 may have a form in which the first section 611-1 of the first reception coil 611, the first shielding member 612, the second section 611-2 of the first reception coil 611, and the heat dissipation member 630 are stacked in order. In an embodiment, the first section 611-1 of the first reception coil 611 may have a form in which multiple Cu layers 611-1A are stacked on one another. For example, the first section 611-1 may have a form in which the multiple Cu layers 611-1A are bonded to one another through an adhesive member. Furthermore, like the first section 611-1, the second section 611-2 of the first reception coil 611 may have a form in which multiple Cu layers 611-2A are stacked on one another, and the third section 611-3 may also have a form in which multiple Cu layers 611-3A are stacked on one another.

In an embodiment, the first reception coil 611 may be in contact with a heat dissipation member 630. For example, referring to FIG. 7B, the second section 611-2 of the first reception coil 611 may be in contact with the heat dissipation member 630. Heat generated from the first reception coil 611 of the first wireless charging antenna 610 may pass through the first section 611-1 and the second section 611-2 of the first reception coil 611 and may be dissipated around the first wireless charging antenna 610 through the heat dissipation member 630. Although not illustrated, the second wireless charging antenna 620 may be formed to have a structure that is identical to the above-mentioned structure of the first wireless charging antenna 610.

According to various embodiments, the first sections 611-1 and 621-1 and the second sections 611-2 and 621-2 of the reception coil 601 of the wireless charging antenna 600 may be connected to each other in various ways. In an embodiment, referring to FIG. 7B, the first sections 611-1 and 621-1 and the second sections 611-2 and 621-2 of the reception coil 601 may be electrically connected to each other by soldering a metal material 640. In this case, the third sections 611-3 and 621-3 of the reception coil 601 may extend from the first sections 611-1 and 621-1 of the reception coil 601 to be connected to the second sections 611-2 and 621-2 of the reception coil 601 through soldering. In an embodiment, referring to FIG. 7C, the first section 611-1 and 621-1 of the reception coil 601 may extend from the first surfaces 612-1 and 622-1 of the shielding member 602 to the second surfaces 612-2 and 622-2 and may be electrically connected to the second sections 611-2 and 621-2 of the reception coil 601. In another embodiment that is not illustrated in the drawings, the reception coil 601 may have a form in which the first surfaces 612-1 and 622-1, the third surfaces 612-3 and 622-3, and the second surfaces 612-2 and 622-2 of the shielding member 602 are wound in order through laser direct structuring (LDS). In addition, the first sections 611-1 and 621-1 and the second sections 611-2 and 621-2 of the reception coil 601 may be connected to each other in various ways.

The first sections 611-1 and 621-1, the second sections 611-2 and 621-2, and the third sections 611-3 and 621-3 of the reception coil 601 described above are merely distinguished for convenience of description. In one or more non-limiting embodiments, the first sections 611-1 and 621-1, the second sections 611-2 and 621-2, and the third sections 611-3 and 621-3 of the reception coil 601 may be elements physically connected to each other. For example, the reception coil 601 of the wireless charging antenna 600 may be disposed on the first surfaces 612-1 and 622-1, the second surfaces 612-2 and 622-2, and the third surfaces 612-3 and 622-3 of the shielding member 602 around which the reception coil 601 is wound multiple times so as to have one pattern.

According to various embodiments, the reception coil 601 of the wireless charging antenna 600 may have a form in which one pattern is wound around the shielding member 602. In an embodiment, the reception coil 601 of the wireless charging antenna 600 may be alternately wound multiple times on the first surfaces 612-1 and 622-1 of the shielding member 602 and on the second surfaces 612-2 and 622-2 opposite to the first surfaces 612-1 and 622-1. The fact that the reception coil 601 is alternately wound on the first surfaces 612-1 and 622-1 and the second surfaces 612-2 and 622-2 of the shielding member 602 may imply that the reception coil 601 having a single shape is divided and arranged on the first surfaces 612-1 and 622-1 and the second surfaces 612-2 and 622-2 of the shielding member 602. In other words, the wireless charging antenna 600 may be formed such that a first section of the reception coil 601 is disposed on the first surfaces 612-1 and a second section of the reception coil 601 different from the first section is disposed on the second surfaces 612-2. Therefore, in some embodiments, it may not be implied that the reception coil 601 is actually alternately wound on the first surfaces 612-1 and 622-1 and the second surfaces 612-2 and 622-2 of the shielding member 602.

According to a non-limiting embodiment, first sections 611-1 and 621-1 of the reception coil 601 of the wireless charging antenna 600 may be parts of the reception coil 601 wound on the first surfaces 612-1 and 622-1 of the shielding member 602. Second sections 611-2 and 621-2 of the reception coil 601 may be parts of the reception coil 601 wound on the second surfaces 612-2 and 622-2 of the shielding member 602.

According to various embodiments, the reception coil 601 of the wireless charging antenna 600 may be wound around the shielding member 602 such that the first sections 611-1 and 621-1, disposed on first surfaces 612-1 and 622-1 of the shielding member 602, and the second sections 611-2 and 621-2, disposed on the second surfaces 612-2 and 622-2 of the shielding member 602, have one or more patterns substantially corresponding to each other. For example, the first the first sections 611-1 and 621-1 can be formed to have a first pattern and the sections 611-2 and 621-2 can be formed to have a second pattern that substantially matches the first pattern. In an embodiment, referring to FIGS. 10A and 10B which will be described later, the reception coil 601 of the wireless charging antenna 600 may be alternately wound multiple times on the first surfaces 612-1 and 622-1 and the second surfaces 612-2 and 622-2 of the shielding member 602 such that the first sections 611-1 and 621-1 and the second sections 611-2 and 621-2 have semicircular shapes. In another embodiment, referring to FIGS. 10A and 10B which will be described later, the reception coil 601 of the wireless charging antenna 600 may be alternately wound on the first surfaces 612-1 and 622-1 and the second surfaces 612-2 and 622-2 of the shielding member 602 such that the first sections 611-1 and 621-1 and the second sections 611-2 and 621-2 have corresponding shapes in the form of a ⅔ circle or a ⅓ circle. In addition, the reception coil 601 of the wireless charging antenna 600 may be alternately wound on the first surfaces 612-1 and 622-1 of the shielding member 602 and the second surfaces 612-2 and 622-2 of the shielding member 602 such that the first sections 611-1 and 621-1 and the second sections 611-2 and 621-2 have shapes corresponding to each other.

According to various embodiments, as described above, in the case of the reception coil 601 of the wireless charging antenna 600, the first sections 611-1 and 621-1 may correspond to the second sections 611-2 and 621-2 in shape with reference to the shielding member 602. Therefore, the winding center of the first section 611-1 of the first reception coil 611 and the winding center of the second section 611-2 thereof may be aligned with each other when seen in the Z-axis direction with reference to FIG. 7A. Likewise, the winding center of the first section 621-1 of the second reception coil 621 and the winding center of the second section 621-2 thereof may be aligned with each other when seen in the Z-axis direction with reference to FIG. 10A which will be described later.

According to various embodiments, the wireless charging antenna 600 according to various embodiments disclosed herein may be formed in a shape in which the wireless charging antenna 500 according to the comparative embodiment can bend or can be folded. In the comparative embodiment, the wireless charging antenna 500 may have a structure in which the reception coil 601 and the shielding member 602 are stacked in order. On the other hand, the wireless charging antenna 600 according to various embodiments disclosed herein may have a structure in which the first sections 611-1 and 621-1 of the reception coil 601, the shielding member 602, and the second sections 611-2 and 621-2 of the reception coil 601 are stacked in order.

In the comparative embodiment, the wireless charging antenna 500 is formed to correspond to a transmission coil of an external electronic device. For example, the reception coil 601 of the wireless charging antenna 600 may be wound multiple times in the form of concentric circles so as to match the innermost pattern and outermost pattern of a transmitting coil of an external electronic device. The reception coil 601 of the wireless charging antenna 600 according to various embodiments disclosed herein may be wound around the shielding member 602 such that the first sections 611-1 and 621-1 of the reception coil 601, wound on the first surfaces 612-1 and 622-1 of the shielding member 602, and the second sections 611-2 and 621-2 of the reception coil 601, wound on the second surfaces 612-2 and 622-2 of the shielding member 602, have patterns substantially corresponding to each other.

The reception coil 601 of the wireless charging antenna 600 according to various embodiments disclosed herein may be wound around the shielding member 602 in various forms. For example, the reception coil 601 may be wound around the shielding member 602 so as to be half or ⅔ the size of the reception coil 601 of the wireless charging antenna 500 in the comparative embodiment. Therefore, the wireless charging antenna 600 may have a smaller size than the wireless charging antenna 500 according to the comparative embodiment, and thus a space for disposing the wireless charging antenna 600 may be secured in the electronic device 400.

According to various embodiments, referring to FIGS. 10A and 10B which will be described later, the wireless charging antenna 600 may be disposed in at least one of the first housing 410 and the second housing 420 such that winding centers C1 and C2 of the reception coil 601 are adjacent to the center part of the electronic device 400. The center part of the electronic device 400 may be positioned in a wireless charging range P (e.g., see FIGS. 9B and 9C). The wireless charging range P may define an area in which the reception coil 601 is disposed in the electronic device 400, and in an embodiment, may imply the center part of the electronic device 400. When a transmission coil disposed in an external electronic device is positioned in the wireless charging range P, the electronic device 400 may be wirelessly charged by the external electronic device. In particular, the magnetic flux of a magnetic field M generated in the transmission coil of the external electronic device is concentrated at the center of the winding of the transmission coil. For example, when the transmission coil is wound multiple times in the form of concentric circles, magnetic flux may be concentrated in the innermost circle (pattern) of the transmission coil. Therefore, when the winding centers C1 and C2 of the reception coil 601 disposed in the electronic device 400 are aligned with the winding center of the transmission coil disposed in the external electronic device, the charging efficiency of the electronic device 400 may increase.

Users may consider that the winding centers C1 and C2 of the reception coil 601 of the wireless charging antenna 600 are positioned in the center part of the electronic device 400. When the center part of the electronic device 400 is aligned with the winding centers C1 and C2 of the reception coil 601, the winding centers C1 and C2 of the reception coil 601 may be aligned with the winding center of the transmission coil. Therefore, the magnetic field M of the transmission coil may be concentrated at the winding centers C1 and C2 of the reception coil 601, and an induced magnetic field offsetting the magnetic field M of the transmission coil may be concentrated at the winding centers C1 and C2 of the reception coil. Therefore, induced currents I1 and I2 of a predetermined level or more may be generated in reception coil 601 by the induced magnetic field, the charging efficiency of the electronic device 400 may be secured at a predetermined level.

According to various embodiments, a magnetic field M generated in the external electronic device may pass between the first sections 611-1 and 621-1 and the second sections 611-2 and 621-2 of the reception coil 601. Accordingly, in the first sections 611-1 and 621-1 and the second sections 611-2 and 621-2 of the reception coil 601, an induced current may be generated to offset a change in the magnetic field M of the external electronic device. However, the first sections 611-1 and 621-1 and the second sections 611-2 and 621-2 of the reception coil 601 are positioned to face each other with reference to the magnetic field M of the external electronic device, and thus induced currents generated in the first sections 611-1 and 621-1 and the second sections 611-2 and 621-2 may flow in opposite directions. In an embodiment, referring to FIG. 7A, when the shielding member 602 is viewed in a first direction (e.g., the +Z direction with reference to FIG. 5A), the directions of induced currents flowing in the first sections 611-1 and 621-1 and the second sections 611-2 and 621-2 of the reception coil 601 may be opposite to each other. For example, as illustrated as illustrated in FIG. 7A, when the magnetic field M of the external electronic device passes through the reception coil 601 in the +Z direction with reference to FIG. 7A, an induced current (I1) rotating in the clockwise direction may be generated in the first sections 611-1 and 621-1 of the reception coil 601, and an induced current I2 rotating in the counterclockwise direction may be generated in the second sections 611-2 and 621-2 of the reception coil 601.

According to various embodiments, either the first wireless charging antenna 610 or the second wireless charging antenna 620 may be disposed in the electronic device 400. According to a non-limiting embodiment, referring to FIG. 8, only the first wireless charging antenna 610 may be disposed in the electronic device 400. When only the first wireless charging antenna 610 is disposed in the electronic device 400, for example, the charging efficiency of the electronic device 400 is shown in Table 1 below.

charging antenna 500 according to the comparative embodiment. In an embodiment, as described above, the first wireless charging antenna 610 may have a form in which the first reception coil 611, the first shielding member 612, and the first reception coil 611 are stacked in order. Therefore, even when being used with half the size of the reception coil 501 of the wireless charging antenna 500 according to the comparative embodiment is used, the reception coil 601 may be wound on the first surface 612-1 and the second surface 612-2 of the first shielding member 612, and thus an induced current of a predetermined level or higher may be secured. Therefore, the first wireless charging antenna 610 may supply power of a predetermined level or higher to the battery 189 of the electronic device 400 to secure charging efficiency at a predetermined level or higher. The magnetic flux of an induced magnetic field generated in the first reception coil 611 of the first wireless charging antenna 610 may be concentrated at the winding center (C1) of the first reception coil 611. Accordingly, the magnetic flux of the induced magnetic field may be proportional to the size of the innermost inner circle (pattern) of the first reception coil 611. Therefore, when the first reception coil 611 of the first wireless charging antenna 610 has a ⅔ circle shape rather than a semicircular shape, the charging efficiency of the electronic device 400 may increase.

Figure 9C:
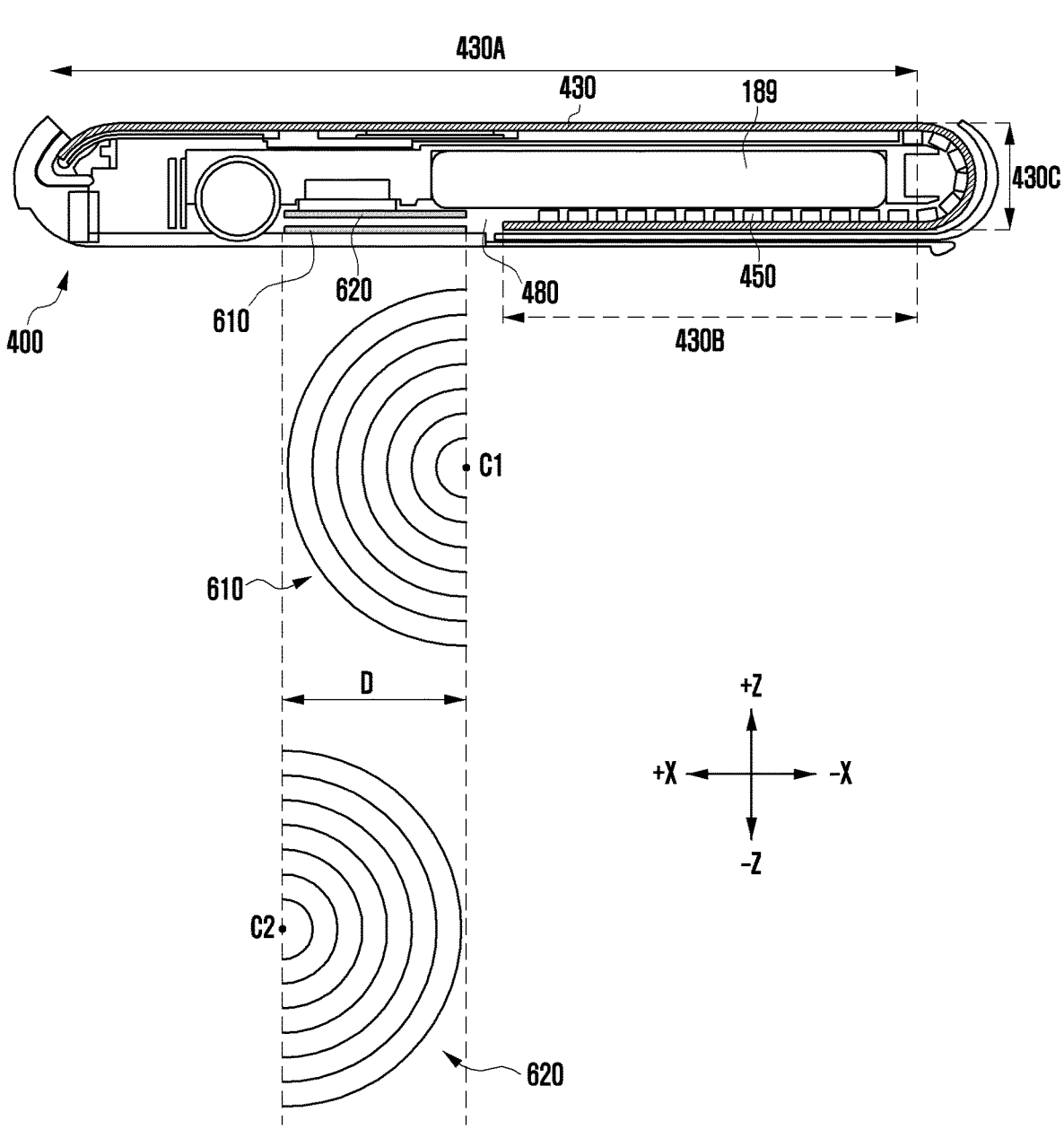
FIG. 9C illustrates the position relationship between a first wireless charging antenna and a second wireless charging antenna while an electronic device according to various embodiments disclosed herein is in a slide-in state.

FIG. 9A illustrates a state in which one pattern formed by a first wireless charging antenna and a second wireless charging antenna according to various embodiments disclosed herein is positioned at the center part of an electronic device. FIG. 9B illustrates the position relationship between a first wireless charging antenna and a second wireless charging antenna while an electronic device according to various embodiments disclosed herein is in a slide-out state. FIG. 9C illustrates the position relationship between a first wireless charging antenna and a second wireless charging antenna while an electronic device according to various embodiments disclosed herein is in a slide-in state. FIG. 10A is a view used to describe the wireless charging efficiency of

TABLE 1

| | Input Voltage Volt(V) | Input Current Ampere(A) | Output Voltage Volt(V) | Output Current Ampere(A) | Input Power Watt(W) | Output Power Watt(W) | Efficiency Eff, % |
|---|---|---|---|---|---|---|---|
| Charging efficiency of wireless charging antenna in comparative embodiment (Default) | 9.004 | 1.378 | 8.975 | 0.985 | 12.408 | 8.840 | 71.3 |
| Charging Efficiency in the case of ⅔ of first reception coil in embodiment disclosed herein | 9.007 | 1.411 | 8.968 | 0.994 | 12.709 | 8.914 | 70.1 |
| Charging Efficiency in the case of half first reception coil in embodiment disclosed herein | 9.001 | 1.661 | 8.966 | 0.995 | 14.951 | 8.921 | 59.7 |

Looking at Table 1, it is possible to determine the charging efficiency of the electronic device 400 when the first reception coil 611 of the first wireless charging antenna 610 is wound around the shielding member 602 so as to be half or ⅔ the size of the reception coil 501 of the wireless an electronic device according to various embodiments disclosed herein when a first wireless charging antenna and a second wireless charging antenna are arranged in the electronic device. FIG. 10B is a view used to describe the wireless charging efficiency of an electronic device when a first wireless charging antenna and a second wireless charging antenna according to various embodiments disclosed herein are arranged to be spaced apart from each other in a specific direction.

According to various embodiments, the above-mentioned wireless charging antenna 600 may be disposed in each of the first housing 410 and the second housing 420. For convenience of description, the wireless charging antenna 600 disposed in the first housing 410 will be described as a first wireless charging antenna 610, and the wireless charging antenna 600 disposed in the second housing 420 will be described as a second wireless charging antenna 620.

According to various embodiments, the first wireless charging antenna 610 may be disposed in the first housing 410 such that a first center C1, which is a winding center of the first reception coil 611, is adjacent to the center part of the electronic device 400. Furthermore, the second wireless charging antenna 620 may be disposed in the second housing 420 such that a second center C2, which is a winding center of the second reception coil 621, is adjacent to the center of the electronic device 400. The center part of the electronic device 400 may imply a wireless charging range P (e.g., see FIGS. 9B and 9C) set in the electronic device 400 such that the electronic device 400 can be wirelessly charged using an external electronic device.

In an embodiment, referring to FIGS. 9A and 9B, the first wireless charging antenna 610 may be disposed in the first housing 410 such that the first center C1 of the first reception coil 611 is adjacent to or aligned with the center part of the electronic device 400 while the electronic device 400 is in a slide-out state. Similarly, the second wireless charging antenna 620 may be disposed in the second housing 420 such that the second center C2 of the second reception coil 621 is adjacent to or aligned with the center part of the electronic device 400 while the electronic device 400 is in a slide-out state.

According to various embodiments, as illustrated in FIGS. 9A and 9B, the first wireless charging antenna 610 and the second wireless charging antenna 620 may be disposed in the first housing 410 and the second housing 420, respectively, such that the first reception coil 611 and the second reception coil 621 form a concentric circle pattern. In an embodiment, referring to FIGS. 9A and 9B, the first wireless charging antenna 610 and the second wireless charging antenna 620 may be disposed in the first housing 410 and the second housing 420, respectively, such that the first center C1, which is the winding center of the first reception coil 611, is adjacent to or aligned with the second center C2, which is the winding center of the second reception coil 621, while the electronic device 400 is in the slide-out state. For example, referring to FIG. 9B, when the electronic device 400 is viewed in a first direction (e.g., the +Z direction with reference to FIG. 9B) while the electronic device 400 is in the slide-out state, the first center C1 of the first reception coil 611 and the second center C2 of the second reception coil 621 may be adjacent to or aligned with each other. Therefore, the first reception coil 611 of the first wireless charging antenna 610 and the second reception coil 621 of the second wireless charging antenna 620 may form a concentric circle pattern. As described above, the first section 611-1 and the second section 611-2 of the first reception coil 611 may correspond to each other, and the first section 621-1 and the second section 621-2 of the second reception coil 621 may also correspond to each other. Therefore, the first section 611-1 of the first reception coil 611 and the first section 621-1 of the second reception coil 621 may form a concentric circle pattern, and the second section 611-2 of the first reception coil 611 and the second section 621-2 of the second reception coil 621 may form a concentric circle pattern.

According to various embodiments, the first reception coil 611 and the second reception coil 621 may be wound in various forms so as to form a concentric circle pattern while the electronic device 400 is in the slide-out state.

In an embodiment, referring to FIG. 10A, the first reception coil 611 may be alternately wound on the first surface 612-1 and the second surface 612-2 of the first shielding member 612 so that the first section 611-1 and the second section 611-2 have a semicircular shape. The second reception coil 621 may be alternately wound on the first surface 622-1 and the second surface 622-2 of the second shielding member 622 so that the first section 621-1 and the second section 621-2 have a semicircular shape.

Figure 10B:
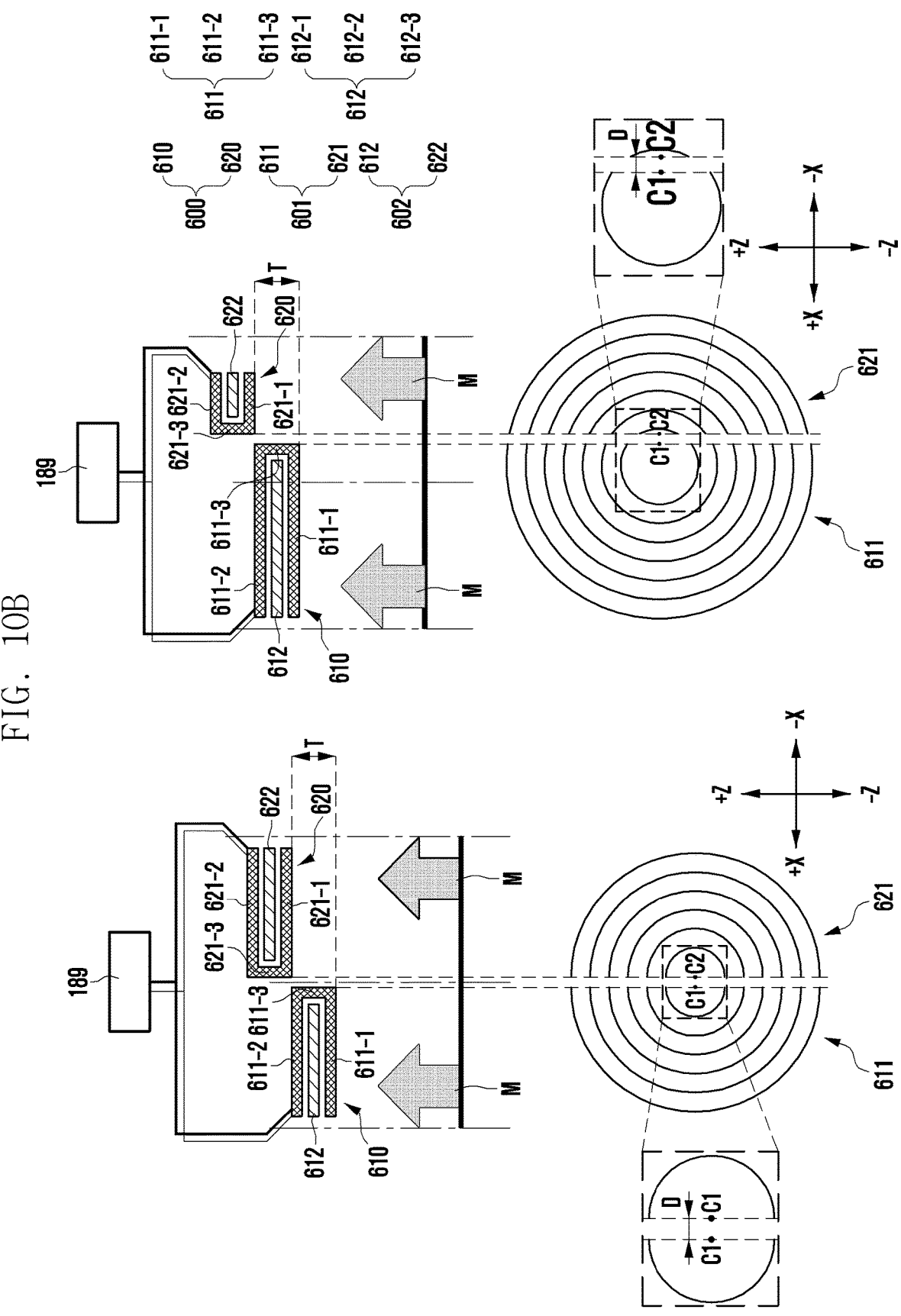
FIG. 10B is a view used to describe the wireless charging efficiency of an electronic device when a first wireless charging antenna and a second wireless charging antenna according to various embodiments disclosed herein are arranged to be spaced apart from each other in a specific direction.

In another embodiment, referring to FIG. 10B, the first reception coil 611 may be alternately wound on the first surface 612-1 and the second surface 612-2 of the first shielding member 612 so that the first section 611-1 and the second section 611-2 have a ⅔ circle shape. For example, both the first section 611-1 and the second section 611-2 of the first reception coil 611 have a ⅔ circle shape, and the first section 611-1 and the second section 611-2 may substantially correspond to each other in shape. The second reception coil 621 may be alternately wound on the first surface 622-1 and the second surface 622-2 of the second shielding member 622 so that the first section 621-1 and the second section 621-2 have a ⅓ circle shape. For example, both the first section 621-1 and the second section 621-2 of the second reception coil 621 have a ⅓ circle shape, and the first section 621-1 and the second section 621-2 may substantially correspond to each other in shape. Therefore, when the electronic device 400 is viewed in the first direction (e.g., +Z direction based on FIG. 10B) while the electronic device 400 is in the slide-out state, the first reception coil 611 and the second reception coil 621 may form a concentric circle pattern.

According to various embodiments disclosed herein, the first reception coil 611 of the first wireless charging antenna 610 and the second reception coil 621 of the second wireless charging antenna 620 may form a concentric circle pattern corresponding to the shape of a transmission coil while the electronic device 400 is in the slide-out state. In an embodiment, a concentric circle pattern formed by the first reception coil 611 and the second reception coil 621 may have a shape substantially corresponding to a transmission coil of an external electronic device. For example, the innermost pattern and the outermost pattern of a concentric circle pattern formed by the first reception coil 611 and the second reception coil 621 may correspond to the innermost pattern and the outermost pattern of the transmitting coil. When the reception coil 601 of the wireless charging antenna 600 disposed inside the electronic device 400 has a shape corresponding to that of the transmission coil of the external electronic device, the charging efficiency of the electronic device 400 may increase.

The magnetic flux of a magnetic field M generated in the transmission coil of the external electronic device is concentrated at the winding center of the transmission coil. The center of a concentric circle pattern formed by the first reception coil 611 and the second reception coil 621 may be adjacent to or aligned with the first center C1 which is the winding center of the first reception coil 611 and the second center C2 which is the winding center of the second reception coil 621. The first center C1 of the first reception coil 611 and the second center C2 of the second reception coil

621 may be positioned in the center part of the electronic device 400. Accordingly, the center of a concentric circle pattern formed by the first reception coil 611 and the second reception coil 621 may be positioned at the center part of the electronic device 400. Therefore, when a user places the winding center of the transmission coil of the external electronic device on the center of the electronic device 400, the magnetic flux of the magnetic field M that is concentrated at the winding center of the transmission coil may be concentrated at the center of a concentric circle pattern formed by the first reception coil 611 and the second reception coil 621. Therefore, the charging efficiency of the electronic device 400 may increase.

According to various embodiments, the distance D between the first center C1 of the first reception coil 611 and the second center C2 of the second reception coil 621 may be changed by sliding of the first housing 410 and the second housing 420.

In an embodiment, referring to FIG. 9B, the distance D between the first center C1 of the first reception coil 611 and the second center C2 of the second reception coil 621 may be minimized when a display module is withdrawn from the receiving space 480 (e.g., a slide-out state). In an embodiment, referring to FIG. 9B, the distance D between the first center C1 of the first reception coil 611 and the second center C2 of the second reception coil 621 may be maximized when the display module is inserted into the receiving space 480 (e.g., a slide-in state). For example, the second wireless charging antenna 620 may be positioned in a first direction (e.g., the +Z direction with reference to FIG. 9C) with respect to the first wireless charging antenna 610 while the electronic device 400 is in a slide-in state. Therefore, when the electronic device 400 is viewed in the first direction in the slide-in-state, the first wireless charging antenna 610 and the second wireless charging antenna 620 may overlap each other. When the electronic device 400 is in the slide-out state, the first center C1 and the second center C2 are closest to or aligned with each other, and thus the first reception coil 611 and the second reception coil 621 may form a concentric circle. Therefore, when the electronic device 400 is switched from the slide-out state to the slide-in state, the distance D between the first center C1 of the first reception coil 611 and the second center C2 of the second reception coil 621 may be maximized.

According to various embodiments, the first wireless charging antenna 610 and the second wireless charging antenna 620 may be disposed in positions in which the first wireless charging antenna 610 and the second wireless charging antenna 620 do not overlap the display module inserted in the receiving space 480 while the electronic device 400 is in the slide-in state. For example, referring to FIGS. 9B and 9C, the first wireless charging antenna 610 and the second wireless charging antenna 620 may be disposed in a space in the receiving space 480 other than a space in which the display module is positioned.

According to various embodiments, as illustrated in FIG. 9C, the second wireless charging antenna 620 may be positioned in the first direction with respect to the first wireless charging antenna 610 while the electronic device 400 is in the slid-in state. Therefore, when the electronic device 400 is viewed in the first direction (e.g., the +Z direction with reference to FIG. 9C) in the slide-in state, the first wireless charging antenna 610 and the second wireless charging antenna 620 may overlap each other. In this case, the first wireless charging antenna 610 may be positioned adjacent to the rear cover so as to be relatively close to the external electronic device. Therefore, the magnetic flux of a magnetic field M of the external electronic device may be applied to the winding center C1 of the first reception coil 611. An induced current by the magnetic field M of the external electronic device may be generated in the first reception coil 611, and the battery 189 may be supplied with power therethrough.

According to various embodiments, when the first reception coil 611 of the first wireless charging antenna 610 and the second reception coil 621 of the second wireless charging antenna 620 form a concentric circle pattern when being viewed in the Z-axis direction with reference to FIG. 9B, the charging efficiency is as shown in Table 2 below.

TABLE 2

| | Input Voltage Volt(V) | Input Current Ampere(A) | Output Voltage Volt(V) | Output Current Ampere(A) | Input Power Watt(W) | Output Power Watt(W) | Efficiency Eff, % |
|---|---|---|---|---|---|---|---|
| Charging efficiency of wireless charging antenna in comparative embodiment (Default) | 9.004 | 1.378 | 8.975 | 0.985 | 12.408 | 8.840 | 71.3 |
| Charging efficiency when first and second reception coils have semicircular shape | 9.001 | 1.497 | 8.964 | 0.996 | 13.474 | 8.928 | 66.3 |
| Charging efficiency when first reception coil has $\frac{2}{3}$ circle shape and second reception coil has $\frac{1}{3}$ circle shape | 9.004 | 1.405 | 8.969 | 0.997 | 12.651 | 8.942 | 70.7 |

Looking at Table 2, as illustrated in FIG. 10, it is possible to determine the charging efficiency of the electronic device 400 when the first section 611-1 and the second section 611-2 of the first reception coil 611 have a semicircular shape, and when the first section 621-1 and the second section 621-2 of the second reception coil 621 have a semicircular shape. The first reception coil 611 and the second reception coil 621 form a single concentric circle pattern while the electronic device 400 is in a slid-out state, and thus, as shown in Table 1, it may be determined that the charging efficiency of the electronic device 400 is increased compared with when only one first wireless charging antenna 610 including the first reception coil 611 having a semicircular shape is used. Furthermore, looking at Table 2, as illustrated in FIG. 10A, it is possible to determine the charging efficiency of the electronic device 400 when the first section 611-1 and the second section 611-2 of the first reception coil 611 have a ⅔ circle shape, and when the first section 621-1 and the second section 621-2 of the second reception coil 621 have a ⅓ circle shape. The first reception coil 611 and the second reception coil 621 form a concentric circle pattern while the electronic device 400 is in the slid-out state, and it may be determined that the charging efficiency of the electronic device 400 is increased compared a semicircular shape, more magnetic flux is secured, so the charging efficiency of the electronic device 400 may increase.

According to various embodiments, as illustrated in FIG. 10B, since the first wireless charging antenna 610 is disposed in the first housing 410 and the second wireless charging antenna 620 is disposed in the second housing 420, the second reception coil 621 may be spaced apart from the first reception coil 611 in the first direction (the +Z direction with reference to FIG. 10B). Referring to FIG. 10B, the second wireless charging antenna 620 may be spaced apart from the first wireless charging antenna 610 by a predetermined distance T in the first direction (e.g., the +Z direction with reference to FIG. 10B). For example, the second section 621-2 of the second wireless charging antenna 620 may be spaced apart from the first section 611-1 of the first wireless charging antenna 610 by the predetermined distance T. Therefore, the first section 611-1 of the first wireless charging antenna 610 and the first section 621-1 of the second wireless charging antenna 620 may not be positioned on the same plane, and the second section 611-2 of the first wireless charging antenna 610 and the second section 621-2 of the second wireless charging antenna 620 may not be positioned on the same plane. The charging efficiency of the electronic device 400 in this case is as follows.

TABLE 3

| | Input Voltage Volt(V) | Input Current Ampere(A) | Output Voltage Volt(V) | Output Current Ampere(A) | Input Power Watt(W) | Output Power Watt(W) | Efficiency Eff, % |
|---|---|---|---|---|---|---|---|
| Charging efficiency of wireless charging antenna in comparative embodiment (Default) | 9.004 | 1.378 | 8.975 | 0.985 | 12.408 | 8.840 | 71.3 |
| Charging efficiency when first and second reception coils have semicircular shape and there is gap between reception coils | 9.003 | 1.521 | 8.967 | 0.997 | 13.694 | 8.940 | 66.3 |
| Charging efficiency when first reception coil has ⅔ circle shape, second reception coil has ⅓ circle shape, and there is gap between reception coils | 9.002 | 1.411 | 8.966 | 0.997 | 12.702 | 8.939 | 70.4 | with when only one first wireless charging antenna 610 including the first reception coil 611 having a ⅔ circle shape is used.

As described above, the magnetic flux of an induced magnetic field generated in the reception coil 601 is concentrated at the winging centers C1 and C2 of the reception coil 601. Accordingly, the magnetic flux of the induced magnetic field may be proportional to the size of the innermost pattern of the reception coil 601. Therefore, when the first reception coil 611 has a ⅔-circle shape rather than Looking at Table 3, it may be found that as illustrated in FIG. 10B, even when the second wireless charging antenna 620 is spaced apart from the first wireless charging antenna 610 by the predetermined distance T in the +Z direction with reference to FIG. 101B, the charging efficiency is only slightly different from the charging efficiency of the electronic device 400 shown in Table 2. Therefore, even when the second housing 420 is spaced apart from the first housing 410 in the +Z direction such that the first housing 410 and the second housing 420 are slidable, the efficiency of charging the electronic device 400 by using the wireless charging antenna 600 may not be affected. According to various embodiments disclosed herein, when the electronic device 400 is viewed in a first direction (e.g., the +Z direction with reference to FIG. 9B) while the electronic device 400 is in a slide-out state, the first center C1 of the first reception coil 611 and the second center C2 of the second reception coil 621 are placed in the electronic device 400 so as to be adjacent to or aligned with the center part of the electronic device 400. Furthermore, while the electronic device 400 is in the slide-out state, the first reception coil 611 of the first wireless charging antenna 610 and the second reception coil 621 of the second wireless charging antenna 620 may form a concentric circle pattern. Therefore, the center of a concentric circle pattern formed by the first reception coil 611 and the second reception coil 621 may be adjacent to or aligned with the center part of the electronic device 400.

It is common for users to understand that the winding center of the reception coil 601 of the wireless charging antenna 600 is positioned at the center part of the electronic device 400. When the center part of the electronic device 400 is aligned with the winding centers C1 and C2 of the reception coil 601, the winding centers C1 and C2 of the reception coil 601 may be aligned with the winding center of a transmission coil. Therefore, since the center of the concentric circle pattern formed by the first reception coil 611 and the second reception coil 621 is adjacent or aligned with the center part of the electronic device 400, the center of the concentric circle pattern formed by the first reception coil 611 and the second reception coil 621 may be aligned with the winding center of a transmission coil of an external electronic device.

Furthermore, as described above, the a concentric circle pattern formed by the first reception coil 611 and the second reception coil 621 may have a shape substantially corresponding to the transmission coil of the external electronic device. When the reception coil 601 of the wireless charging antenna 600 disposed in the electronic device 400 has a shape corresponding to the transmission coil of the external electronic device, the charging efficiency of the electronic device 400 may increase. In particular, the magnetic flux of a magnetic field M generated in the transmission coil of the external electronic device is concentrated at the winding center of the transmission. The center of the a concentric circle pattern formed by the first reception coil 611 and the second reception coil 621 may be adjacent to or aligned with the first center C1, which is the winding center of the first reception coil 611, and the second center C2, which is the winding center of the second reception coil. When the center of the a concentric circle pattern formed by the first reception coil 611 and the second reception coil 621 is aligned with the winding center of the transmission coil of the external electronic device, magnetic flux due to a magnetic field M of the transmission coil and magnetic flux due to an induced magnetic field of the reception coil 601 may be concentrated at the winding centers C1 and C2 of the reception coil 601 and the winding center of the transmission coil. Therefore, when a user aligns the winding center of the transmission coil of the external electronic device with the center part of the electronic device 400, the winding center of the transmission coil is aligned with the center of the a concentric circle pattern formed by the first reception coil 611 and the second reception coil 621, and thus the charging efficiency of the electronic device 400 may increase.

Figure 11A:
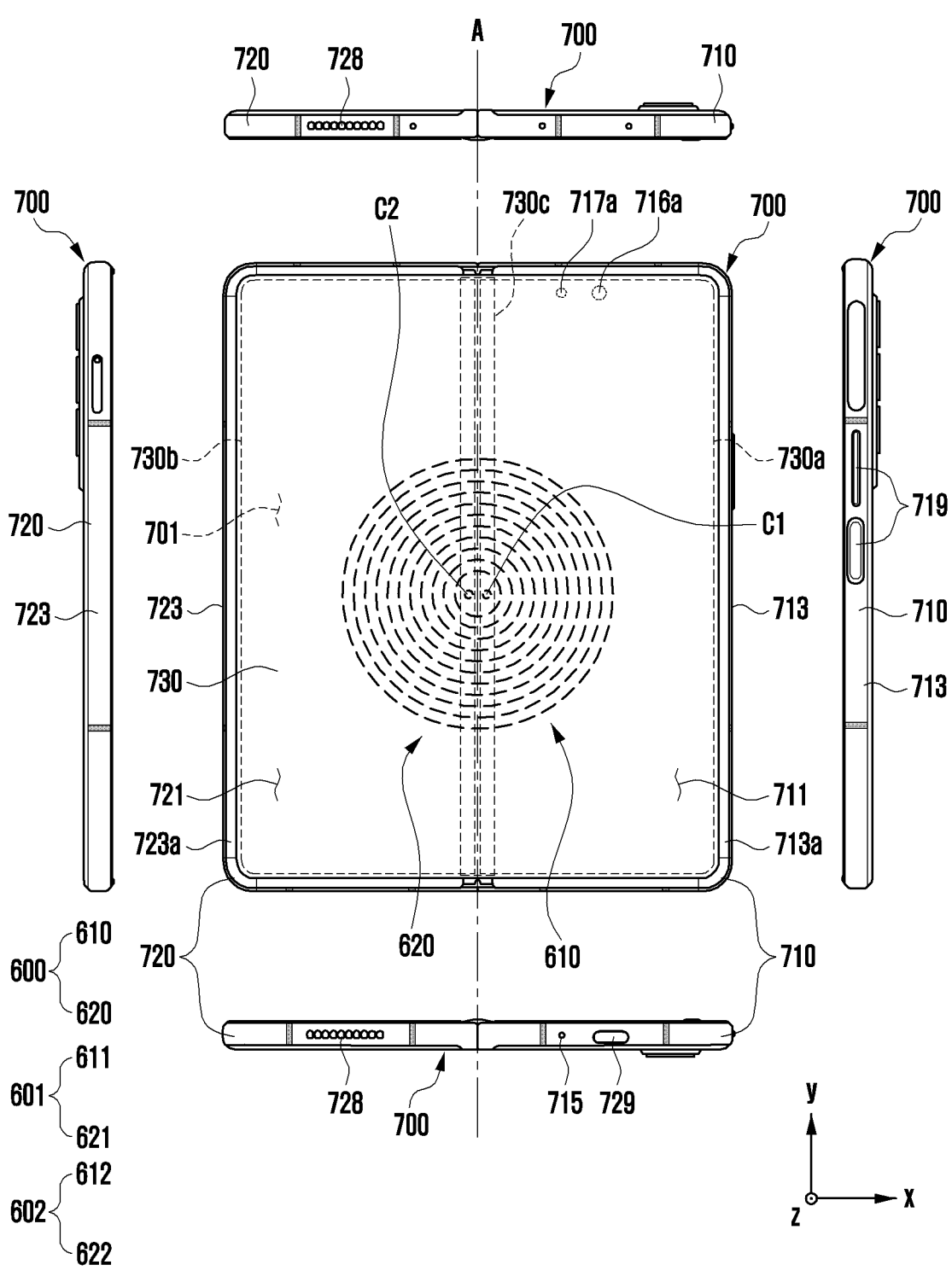
FIGS. 11A and 11B are front and rear views of an electronic device, which is in an unfolded state, according to various embodiments disclosed herein.
Figure 11B:
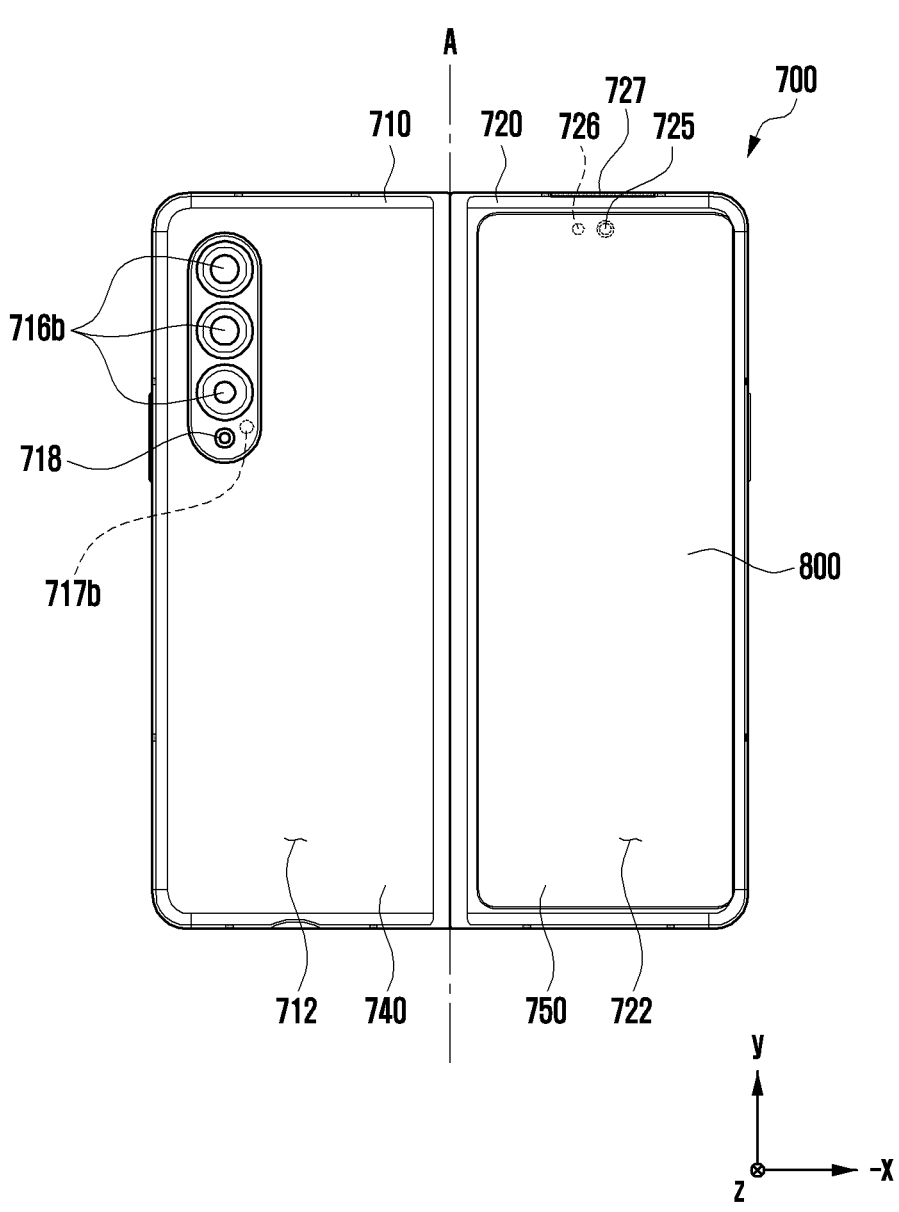

FIGS. 11A and 11B are front and rear views of an electronic device, which is in an unfolded state, according to various embodiments disclosed herein.

Figure 12A:
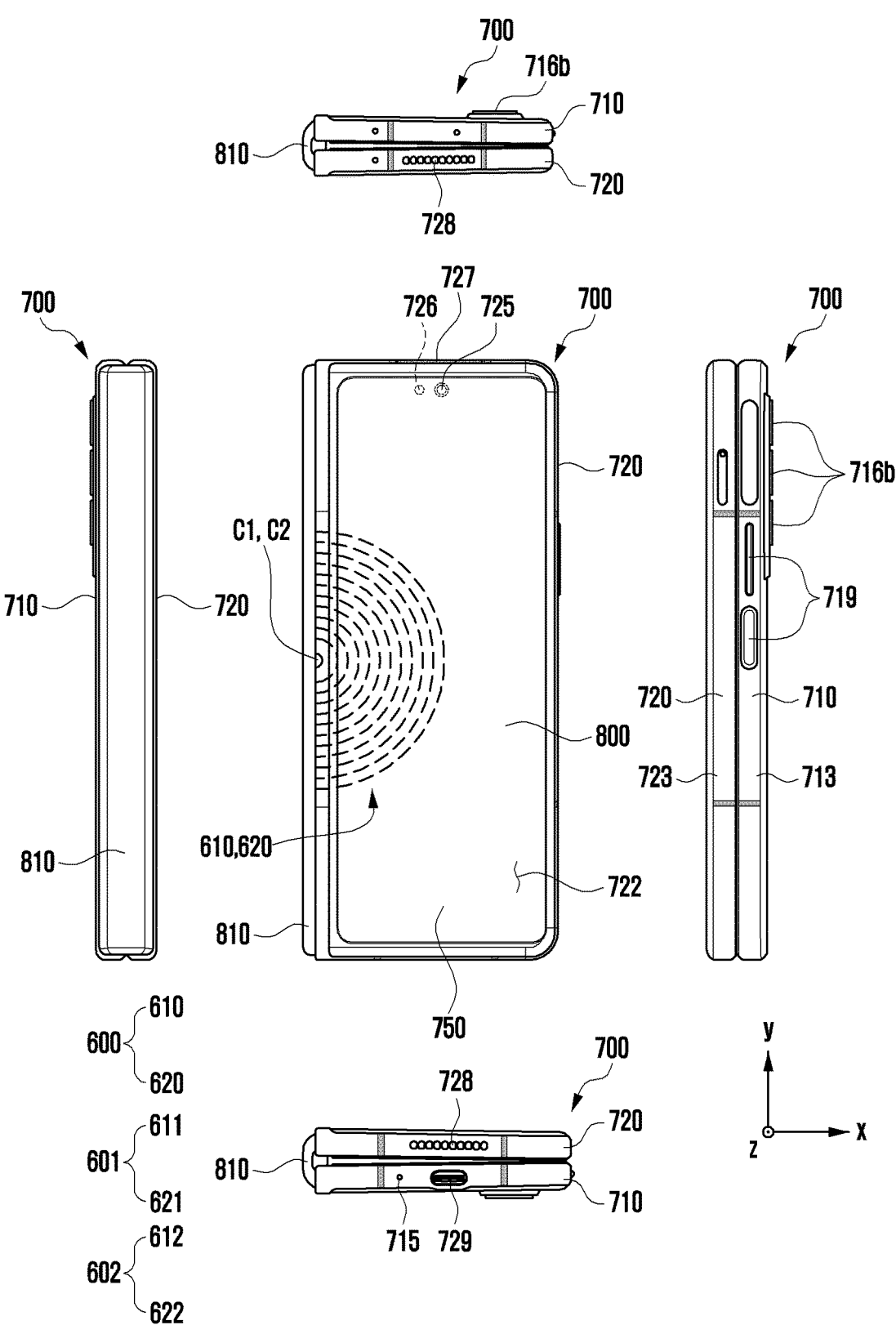
FIGS. 12A and 12B are front and rear views of an electronic device, which is in a folded state, according to various embodiments disclosed herein.
Figure 12B:
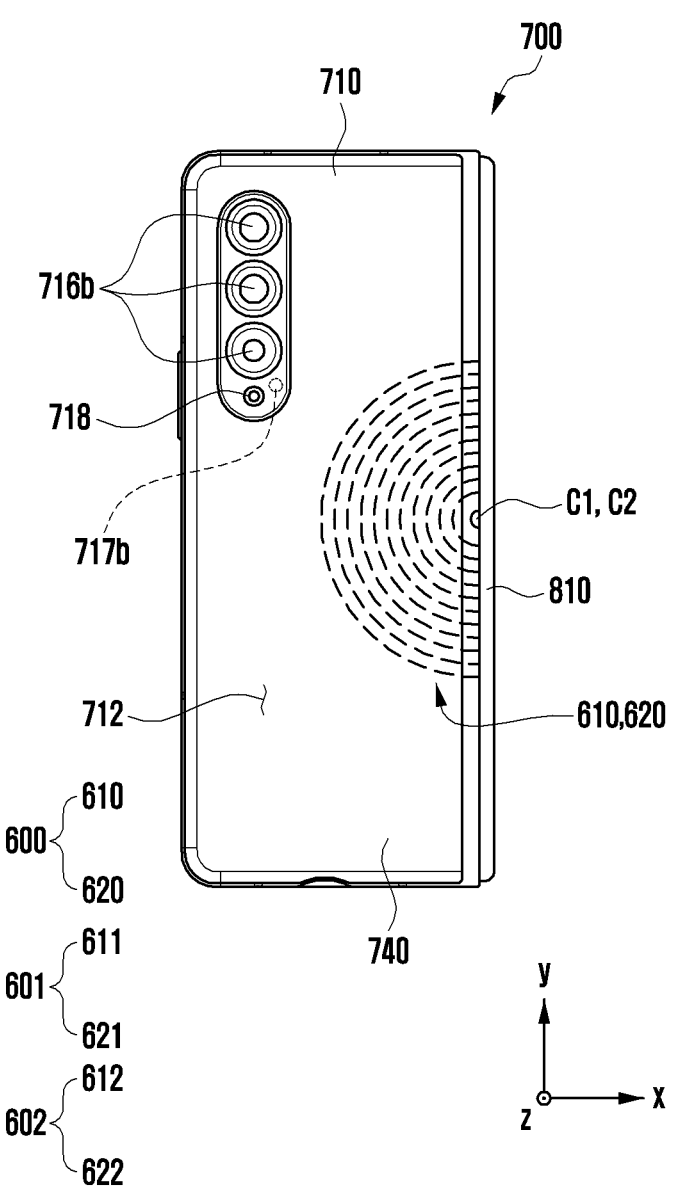

FIGS. 12A and 12B are front and rear views of an electronic device, which is in a folded state, according to various embodiments disclosed herein.

An electronic device 700 described below may be the electronic device 700 having a form factor different from that of the electronic device 400 described with reference to FIGS. 4A to 10B, and a first housing 710 and a second housing 720 are foldably connected to each other.

Referring to FIGS. 11A to 12B, the electronic device 700 may include a pair of housings 710 and 720 coupled to each other through a hinge device to be rotatable about a folding axis A so as to be foldable with respect to each other (e.g., a foldable housing structure), a first display 730 (e.g., a flexible display, a foldable display, or a main display) disposed through the pair of housings 710 and 720, and/or a second display 800 (e.g., a sub-display) disposed through the second housing 720. According to an embodiment, at least a part of the hinge device may be disposed to be invisible from the outside through the first housing 710 and the second housing 720, and may be disposed to be invisible from the outside through a hinge housing 810 covering a foldable part in an unfolded state. According to an embodiment, the hinge device may include a gear assembly including multiple gears, a hinge module which is coupled to hinge shafts rotating through the gear assembly and includes multiple hinge cams for performing a cam interlocking operation, and hinge plates connecting the hinge module to the first housing 710 and the second housing 720. Herein, a surface on which the first display 730 is disposed may be defined as the front surface of the electronic device 700, and a surface opposite to the front surface may be defined as the rear surface of the electronic device 700. In addition, a surface surrounding the space between the front surface and the rear surface may be defined as the side surface of the electronic device 700.

According to various embodiments, the pair of housings 710 and 720 may include the first housing 710 and the second housing 720 disposed to be foldable with respect to each other through the hinge device. According to an embodiment, the pair of housings 710 and 720 are not limited to the shapes and coupling illustrated in FIGS. 11A to 12B, and may be implemented by a combination and/or coupling of other shapes or elements. According to an embodiment, the first housing 710 and the second housing 720 may be disposed on both sides with reference to the folding axis A, and may have shapes that are overall symmetrical to each other with respect to the folding axis A. According to one embodiment, the first housing 710 and the second housing 720 may be asymmetrically folded about the folding axis A. According to an embodiment, the angle or the distance formed between the first housing 710 and the second housing 720 may vary depending on whether the electronic device 700 is in an unfolded state, a folded state, or an intermediate state.

According to various embodiments, the first housing 710 may include a first surface 711 connected to the hinge device in the unfolded state of the electronic device 700 and disposed to face the front surface of the electronic device 700, a second surface 712 facing a direction opposite to a direction faced by the first surface 711, and/or a first side member 713 surrounding at least a part of a first space between the first surface 711 and the second surface 712. According to an embodiment, the second housing 720 may include a third surface 721 connected to the hinge device in the unfolded state of the electronic device 700 and disposed to face the front surface of the electronic device 700, a fourth surface 722 facing a direction opposite to a direction faced by the third surface 721, and/or a second side member 723 surrounding at least a part of a second space between the third surface 721 and the fourth surface 722. According to an embodiment, the first surface 711 may face substantially the same direction as the third surface 721 in the unfolded state, and may at least partially face the third surface 721 in the folded state. According to an embodiment, the electronic device 700 may include a recess 701 formed to receive the first display 730 through structural coupling of the first housing 710 and the second housing 720. According to an embodiment, the recess 701 may have substantially the same size as the first display 730. According to an embodiment, the first housing 710 may include a first protective frame 713a (e.g., a first decorative member) coupled, when the first display 730 is viewed from above, to the first side member 713 and disposed to overlap the edge of the first display 730 so that the edge of the first display 730 is covered so as not to be seen from the outside. According to an embodiment, the first protective frame 713a may be formed integrally with the first side member 713. According to an embodiment, the second housing 720 may include a second protective frame 723a (e.g., a second decorative member) coupled, when the first display 730 is viewed from above, to the second side member 723 and disposed to overlap the edge of the first display 730 so that the edge of the first display 730 is covered so as not to be seen from the outside. According to an embodiment, the second protective frame 723a may be formed integrally with the second side member 723. In an embodiment, the first protective frame 713a and the second protective frame 723a may be omitted.

According to various embodiments, the hinge housing 810 (e.g., a hinge cover) may be disposed between the first housing 710 and the second housing 720, and may be disposed to cover a part (e.g., at least one hinge module) of the hinge device disposed in the hinge housing 810. According to an embodiment, the hinge housing 810 may be covered by a part of the first housing 710 and a part of the second housing 720 or exposed to the outside depending on the unfolded state, the folded state, or the intermediate state of the electronic device 700. For example, when the electronic device 700 is in the folded state, at least a part of the hinge housing 810 may be covered by the first housing 710 and the second housing 720, and thus may not be substantially exposed. According to an embodiment, when the electronic device 700 is in the folded state, at least a part of the hinge housing 810 may be exposed to the outside between the first housing 710 and the second housing 720. According to an embodiment, in the case of the intermediate state in which the first housing 710 and the second housing 720 are folded with a certain angle, the hinge housing 810 may be at least partially exposed to the outside of the electronic device 700 between the first housing 710 and the second housing 720. For example, an area of the hinge housing 810 exposed to the outside may be smaller than in a fully folded state. According to an embodiment, the hinge housing 810 may include a curved surface.

According to various embodiments, when the electronic device 700 is in an unfolded state (e.g., the state in FIGS. 11A and 11B), the first housing 710 and the second housing 720 may form an angle of about 180 degrees, and a first area 730a, a second area 730b, and a folding area 730c of the first display 730 may be disposed to form the same plane and face substantially the same direction (e.g., the z-axis direction). In another embodiment, when the electronic device 700 is in an unfolded state, the first housing 710 may rotate about an angle 360 degrees with respect to the second housing 720 to be reversely folded such that the second surface 712 faces the fourth surface 722 (an out-folding method).

According to various embodiments, when the electronic device 700 is in a folded state (e.g., the state in FIGS. 12A and 12B), the first surface 711 of the first housing 710 and the third surface 721 of the second housing 720 may be arranged to face each other. In this case, the first area 730a and the second area 730b of the first display 730 may form a narrow angle (e.g., in the range of 0 degrees to about 10 degrees) with each other through the folding area 730c, and may be arranged to face each other. According to an embodiment, at least a part of the folding area 730c may be deformed into a curved shape having a predetermined curvature. According to an embodiment, when the electronic device 700 is in an intermediate state, the first housing 710 and the second housing 720 may be arranged with a certain angle between each other. In this case, the first area 730a and the second area 730b of the first display 730 may form an angle greater than that of the folded state and smaller than that of the unfolded state, and the curvature of the folding area 730c may be smaller than that of the folded state and greater than that of the unfolded state. In an embodiment, the first housing 710 and the second housing 720 may form, through the hinge device, an angle that can be stopped at a designated angle between the folded state and the unfolded state (a free stop function). In an embodiment, the first housing 710 and the second housing 720 may be continuously operated while being pressed in the unfolding direction or folding direction with reference to a designated inflection angle through the hinge device.

According to various embodiments, the electronic device 700 may include at least one among at least one display 730 or 800 disposed in the first housing 710 and/or the second housing 720, an input device 715, sound output devices 727 and 728, sensor modules 717a, 717b, and 726, camera modules 716a, 716b, and 725, key input devices 719, an indicator (not shown), or a connector port 729. In an embodiment, in the electronic device 700, at least one of the elements may be omitted, or at least one other element may be additionally included.

According to various embodiments, the at least one display 730 or 800 may include the first display 730 (e.g., a flexible display module) disposed to be supported by the first surface 711 of the first housing 710, the hinge device, and the third surface 721 of the second housing 720, and the second display 800 disposed in the inner space of the second housing 720 so as to be at least partially visible from the outside through the fourth surface 722. In an embodiment, the second display 800 may be disposed in the inner space of the first housing 710 so as to be visible from the outside through the second surface 712. According to an embodiment, the first display 730 may be mainly used when the electronic device 700 is in the unfolded state, and the second display 800 may be mainly used when the electronic device 700 is in the folded state. According to an embodiment, in the intermediate state, the electronic device 700 may control, based on the folding angle of the first housing 710 and the second housing 720, the first display 730 and/or the second display 800 to be usable.

According to various embodiments, the first display 730 may be disposed in a receiving space formed by the pair of housings 710 and 720. For example, the first display 730 may be disposed in the recess 701 formed by the pair of housings 710 and 720, and may be disposed to occupy, in the unfolded state, substantially most of the front surface of the electronic device 700. According to an embodiment, the first display 730 may include a flexible display module having at least a partial area deformable into a flat or curved surface. According to an embodiment, the first display 730 may include the first area 730a facing the first housing 710 and the second area 730b facing the second housing 720. According to an embodiment, the first display 730 may include the folding area 730c including a part of the first area 730a and a part of the second area 730b with reference to the folding axis A. According to an embodiment, at least a part of the folding area 730c may include an area corresponding to the hinge device. According to an embodiment, the division of the area of the first display 730 is merely an exemplary physical division by the pair of housings 710 and 720 and the hinge device, and substantially, the first display 730 may be displayed as one seamless full screen through the pair of housings 710 and 720 and the hinge device. According to an embodiment, the first area 730a and the second area 730b may have shapes overall symmetrical to each other or shapes partially asymmetrical to each other with reference to the folding area 730c.

According to various embodiments, the electronic device 700 may include a first rear cover 740 disposed on the second surface 712 of the first housing 710 and a second rear cover 750 on the fourth surface 722 of the second housing 720. In an embodiment, at least a part of the first rear cover 740 may be formed integrally with the first side member 713. In an embodiment, at least a part of the second rear cover 750 may be formed integrally with the second side member 723. According to an embodiment, at least one of the first rear cover 740 and the second rear cover 750 may be formed of a substantially transparent plate (e.g., a polymer plate or a glass plate including various coating layers) or an opaque plate. According to an embodiment, the first rear cover 740 may be formed of an opaque plate, such as coated or colored glass, ceramic, polymer, metal (e.g., aluminum, stainless steel (STS), or magnesium), or a combination of at least two of the above-mentioned materials. According to an embodiment, the second rear cover 750 may be formed of a substantially transparent plate, such as glass or polymer. Therefore, the second display 800 may be disposed in the inner space of the second housing 720 so as to be visible from the outside through the second rear cover 750.

According to various embodiments, the input device 715 may include a microphone. In an embodiment, the input device 715 may include multiple microphones disposed to sense the direction of sound. According to an embodiment, the sound output devices 727 and 728 may include speakers. According to an embodiment, the sound output devices 727 and 728 may include a call receiver 727, disposed through the fourth surface 722 of the second housing 720, and an external speaker 728, disposed through at least a part of the second side member 723 of the second housing 720. In an embodiment, the input device 715, the sound output devices 727 and 728, and the connector port 729 may be arranged in spaces of the first housing 710 and/or the second housing 720, and may be exposed to the external environment through at least one hole formed in the first housing 710 and/or the second housing 720. In an embodiment, the holes formed in the first housing 710 and/or the second housing 720 may be used in common for the input device 715 and the sound output devices 727 and 728. In an embodiment, the sound output devices 727 and 728 may include a speaker (e.g., a piezo speaker) operating without any hole formed in the first housing 710 and/or the second housing 720.

According to various embodiments, the camera modules 716a, 716b, and 725 may include a first camera module 716a disposed in the first surface 711 of the first housing 710, a second camera module 716b disposed on the second surface 712 of the first housing 710, and/or a third camera module 725 disposed in the fourth surface 722 of the second housing 720. According to an embodiment, the electronic device 700 may include a flash 718 disposed near the second camera module 716b. According to an embodiment, the flash 718 may include, for example, a light-emitting diode or a xenon lamp. According to an embodiment, the camera modules 716a, 716b, and 725 may include one or multiple lenses, an image sensor, and/or an image signal processor. In an embodiment, at least one camera module of the camera modules 716a, 716b, and 725 may include two or more lenses (e.g., wide-angle and telephoto lenses) and image sensors, and may be disposed together on any one surface of the first housing 710 and/or the second housing 720.

According to various embodiments, the sensor modules 717a, 717b, and 726 may generate an electrical signal or data value corresponding to an operation state inside the electronic device 700 or an environmental state outside the electronic device 700. According to an embodiment, the sensor modules 717a, 717b, and 726 may include a first sensor module 717a disposed in the first surface 711 of the first housing 710, a second sensor module 717b disposed in the second surface 712 of the first housing 710, and/or a third sensor module 726 disposed in the fourth surface 722 of the second housing 720. In an embodiment, the sensor modules 717a, 717b, and 726 may include at least one among a gesture sensor, a grip sensor, a color sensor, an infrared (IR) sensor, an illuminance sensor, an ultrasonic sensor, an iris recognition sensor, or a distance detection sensor (e.g., a time-of-flight (TOF) sensor or light detection and ranging (LiDAR)).

According to various embodiments, the electronic device 700 may further include at least one of sensor modules, which are not shown, for example, a barometric pressure sensor, a magnetic sensor, a biosensor, a temperature sensor, a humidity sensor, or a fingerprint recognition sensor. In an embodiment, the fingerprint recognition sensor may be disposed through at least one of the first side member 713 of the first housing 710 and/or the second side member 723 of the second housing 720.

According to various embodiments, the key input devices 719 may be disposed to be exposed to the outside through the first side member 713 of the first housing 710. In an embodiment, the key input devices 719 may be disposed to be exposed to the outside through the second side member 723 of the second housing 720. In an embodiment, the electronic device 700 may not include some or all of the key input devices 719, and the key input devices 719, which are not included in the electronic device 700, may be implemented in another form, such as a soft key, on the at least one display 730 or 800. In another embodiment, the key input devices 719 may be implemented using a pressure sensor included in the at least one display 730 or 800.

According to various embodiments, the connector port 729 may include a connector (e.g., a USB connector or an IF module (an interface connector port module)) for transmitting and receiving power and/or data to and from an external electronic device. In an embodiment, the connector port 729 may further include a separate connector port (e.g., an ear jack hole) for performing a function of transmitting and receiving an audio signal to and from an external electronic device together therewith or performing an audio signal transmission/reception function.

According to various embodiments, at least one camera module 716a or 725 among the camera modules 716a, 716b, and 725, at least one sensor module 717a or 726 among the sensor modules 717a, 717b, and 726, and/or the indicator may be arranged to be exposed through at least one display 730 or 800. For example, the at least one camera module 716a or 725, the at least one sensor module 717a or 726, and/or the indicator may be arranged under a display area of the at least one display 730 or 800 in the inner space of at least one housing 710 or 720, and may be arranged to be in contact with the external environment through a transparent area or an opening formed up to a cover member (e.g., a window layer (not shown) of the first display 730 and/or the second rear cover 750). According to an embodiment, an area in which the at least one display 730 or 800 faces the at least one camera module 716a or 725 is a part of an area for displaying a content, and may be formed as a transmissive area having a predetermined transmittance. According to an embodiment, the transmissive area may be formed to have a transmittance in a range of about 5% to about 20%. The transmissive area may include an area overlapping an effective area (e.g., a field-of-view area) of the at least one camera module 716a or 725 through which light for generating an image by being imaged by an image sensor passes. For example, the transmissive area of each of the displays 730 and 800 may include an area having a lower pixel density than the surrounding area. For example, the transmissive area may replace the opening. For example, the at least one camera module 716a or 725 may include an under-display camera (UDC) or an under-panel camera (UPC). In another embodiment, some camera modules or sensor modules 717a and 726 may be arranged to perform functions thereof without being visually exposed through the displays. For example, areas facing the camera modules 716a and 725 and/or the sensor modules 717a and 726 disposed under the displays 730 and 800 (e.g., display panels) may be under-display camera (UDC) structures, and thus a perforated opening may be unnecessary.

According to various embodiments, the first wireless charging antenna 610 and the second wireless charging antenna 620 may be disposed in the first housing 710 and the second housing 720, respectively, such that the first reception coil 611 and the second reception coil 621 form a concentric circle pattern. In an embodiment, the first wireless charging antenna 610 and the second wireless charging antenna 620 may be disposed in the first housing 710 and the second housing 720, respectively, such that when the electronic device 700 is in an unfolded state, the first center C1, which is the winding center of the first reception coil 611 is adjacent to or aligned with the second center C2, which is the winding center of the second reception coil 621. For example, referring to FIG. 11A, when the electronic device 700 is viewed in a first direction (e.g., the Z-axis direction with reference to FIG. 11A) while the electronic device 700 is in the unfolded state, the first center C1 of the first reception coil 611 may be adjacent to or aligned with the second center C2 of the second reception coil 621. The first reception coil 611 of the first wireless charging antenna 610 and the second reception coil 621 of the second wireless charging antenna 620 may form a concentric circle pattern. As described above, the first section 611-1 and the second section 611-2 of the first reception coil 611 correspond to each other, and the first section 621-1 and the second section 621-2 of the second reception coil 621 also correspond to each other. Therefore, the first section 611-1 of the first reception coil 611 and the first section 621-1 of the second reception coil 621 may form a concentric circle pattern, and the second section 611-2 of the first reception coil 611 and the second section 621-2 of the second reception coil 621 may form a concentric circle pattern.

According to various embodiments, when the electronic device 700 is viewed in the first direction (e.g., the Z-axis direction with reference to FIG. 11A) while the electronic device 700 is in a folded state, the first center C1 of the first reception coil 611 and the second center C2 of the second reception coil 621 may be adjacent to or aligned with the center of the electronic device 700.

According to various embodiments disclosed herein, the a concentric circle pattern formed by the first reception coil 611 and the second reception coil 621 may have a shape substantially corresponding to the transmission coil of an external electronic device (e.g., the electronic device 102 in FIG. 1). When the reception coil 601 of the wireless charging antenna 600 disposed in the electronic device 700 has a shape corresponding to the transmission coil of the external electronic device, the charging efficiency of the electronic device 700 may increase. In particular, the magnetic flux of a magnetic field M generated in the transmission coil of the external electronic device is concentrated at the winding center of the transmission. The center of the a concentric circle pattern formed by the first reception coil 611 and the second reception coil 621 may be adjacent to or aligned with the first center C1, which is the winding center of the first reception coil 611, and the second center C2, which is the winding center of the second reception coil 621. When the center of the a concentric circle pattern formed by the first reception coil 611 and the second reception coil 621 is aligned with the winding center of the transmission coil of the external electronic device, magnetic flux due to the magnetic field M of the transmission coil and magnetic flux due to an induced magnetic field of the reception coil 601 may be concentrated at the winding centers C1 and C2 of the reception coil 601 and the winding center of the transmission coil. Therefore, when a user aligns the winding center of the transmission coil of the external electronic device with the center of the electronic device 400, the winding center of the transmission coil is aligned with the center of the a concentric circle pattern formed by the first reception coil 611 and the second reception coil 621, and thus the charging efficiency of the electronic device 400 may increase.

According to various embodiments, referring to FIGS. 12A and 12B, when the electronic device 700 is viewed in a first direction (e.g., the Z-axis direction with reference to FIG. 11A) while the electronic device 700 is in a folded state, the first reception coil 611 of the first wireless charging antenna 610 may overlap the second reception coil 621 of the second wireless charging antenna 620. In this case, the first wireless charging antenna 610 may be positioned adjacent to the rear cover 750 to be relatively close to an external electronic device. Therefore, a magnetic field M of the external electronic device may be applied to the first reception coil 611 of the first wireless charging antenna 610. An induced current by the magnetic field M of the external electronic device may be generated in the first reception coil 611, and power may be supplied to the battery 189 therethrough.

An electronic device (e.g., the electronic device 101 in FIG. 1, the electronic device 400 in FIG. 4A, or the electronic device 700 in FIG. 11A) according to various embodiments disclosed herein may include a first housing (e.g., the first housing 410 in FIG. 4A or the first housing 710 in FIG. 11A), a second housing (e.g., the second housing 420 in FIG. 4A or the second housing 720 in FIG. 11A) connected to the first housing such that the position thereof relative to the first housing is variable, a wireless charging antenna 600 which includes a shielding member 602 and a reception coil 601 alternately wound on a first surface (e.g., a surface facing the −Z direction with reference to FIG. 9B) of the shielding member and a second surface (e.g., a surface facing the +Z direction with reference to FIG. 9B) opposite to the first surface, the wireless charging antenna 600 being disposed in at least one of the first housing and the second housing, and a battery 189 electrically connected to the wireless charging antenna.

Furthermore, the reception coil of the wireless charging antenna may be wound such that the first surface of the shielding member and the second surface of the shielding member have patterns substantially corresponding to each other.

Furthermore, the wireless charging antenna may be disposed in at least one of the first housing and the second housing such that the winding center (e.g., the first center C1 or the second center C2 in FIG. 10A) of the reception coil is adjacent to the center of the electronic device.

Furthermore, the wireless charging antenna may include a first wireless charging antenna 610 including a first shielding member 612 and a first reception coil 611 alternately wound on a first surface 612-1 of the first shielding member and a second surface 612-2 opposite to the first surface, the first wireless charging antenna being disposed in the first housing, and a second wireless charging antenna 620 including a second shielding member 622 and a second reception coil 621 alternately wound on a first surface 622-1 of the second shielding member and a second surface 622-2 opposite to the first surface, the second wireless charging antenna being disposed in the second housing.

Furthermore, the first wireless charging antenna may include a first center C1 which is the winding center of the first reception coil, the second wireless charging antenna may include a second center C2 which is the winding center of the second reception coil, and the first wireless charging antenna and the second wireless charging antenna may be disposed such that at least one of the first center of the first reception coil and the second center of the second reception coil is adjacent to the center of the electronic device.

Furthermore, the second housing may be slidably coupled to the first housing, the electronic device may further include a display module 430 (e.g., the display module 160 in FIG. 1), at least a part of which is inserted into a receiving space 480 in the electronic device or withdrawn from the receiving space by sliding of the second housing, and the distance D between the first center of the first wireless charging antenna and the second center of the second wireless charging antenna may be changed when the second housing slides with respect to the first housing.

Furthermore, the distance between the first center of the first wireless charging antenna and the second center of the second wireless charging antenna may be shorter when the display module is withdrawn from the receiving space than when the display module is inserted into the receiving space.

Furthermore, the first wireless charging antenna and the second wireless charging antenna may form a concentric circle pattern when one surface (e.g., a surface facing the −Z direction with reference to FIG. 9B) of the electronic device is viewed in a first direction (e.g., the +Z direction with reference to FIG. 9B) while the display module is withdrawn from the receiving space.

Furthermore, the second wireless charging antenna may be positioned in a first direction (e.g., the +Z direction with reference to FIG. 9B) with respect to the first wireless charging antenna while the display module is inserted into the receiving space, and the first wireless charging antenna may at least partially overlap the second wireless charging antenna when one surface (e.g., a surface facing the −Z direction with reference to FIG. 9B) of the electronic device is viewed in the first direction.

Furthermore, while the display module is inserted into the receiving space, the distance between the first center of the first wireless charging antenna and the second center of the electronic device may be shorter than the distance between the second center of the second wireless charging antenna and the center of the electronic device.

Furthermore, the first housing and the second housing may be foldably connected to each other.

Furthermore, the first wireless charging antenna and the second wireless charging antenna may form a concentric circle pattern when one surface (e.g., a surface facing the Z-axis direction with reference to FIG. 12A) of the electronic device is viewed in a first direction (e.g., the Z-axis direction with reference to FIG. 12A) while the first housing and the second housing is unfolded.

Furthermore, the second wireless charging antenna may be positioned in a first direction (e.g., the Z-axis direction with reference to FIG. 12A) with respect to the first wireless charging antenna while the first housing and the second housing are folded, and the first wireless charging antenna may at least partially overlap the second wireless charging antenna when one surface (e.g., a surface facing the Z-axis direction with reference to FIG. 12A) of the electronic device is viewed in the first direction.

Furthermore, an induced current may be generated in the reception coil by an externally applied magnetic field, and when one surface of the electronic device is viewed in a first direction (e.g., the Z-axis direction with reference to FIG. 12A), the directions of induced currents flowing in a part of the reception coil disposed on the first surface of the shielding member and a part of the reception coil disposed on the second surface of the shielding member are opposite to each other.

Furthermore, the shielding member may shield noise generated by the electromagnetic force and/or operating frequency of the wireless charging antenna.

According to various embodiments disclosed herein, a wireless charging antenna 600, which is included in an electronic device (e.g., the electronic device 101 in FIG. 1, the electronic device 400 in FIG. 4A, or the electronic device 700 in FIG. 11A) including a first housing (e.g., the first housing 410 in FIG. 4A or the first housing 710 in FIG. 11A) and a second housing (e.g., the second housing 420 in FIG. 4A or the second housing 720 in FIG. 11A) slidably coupled to each other and which is disposed in at least one the first housing and the second housing, may include a shielding member 602 and a reception coil 601 alternately wound on a first surface (e.g., a surface facing the −Z direction with reference to FIG. 9B) of the shielding member and a second surface (e.g., a surface facing the +Z direction with reference to FIG. 9B) opposite to the first surface.

Furthermore, the reception coil of the wireless charging antenna may be wound such that the first surface of the shielding member and the second surface of the shielding member have patterns substantially corresponding to each other.

Furthermore, the wireless charging antenna may include a first wireless charging antenna 610 including a first shielding member 612 and a first reception coil 611 alternately wound on a first surface 612-1 of the first shielding member and a second surface 612-2 opposite to the first surface, the first wireless charging antenna being disposed in the first housing, and a second wireless charging antenna 620 including a second shielding member 622 and a second reception coil 621 alternately wound on a first surface 622-1 of the second shielding member and a second surface 622-2 opposite to the first surface, the second wireless charging antenna being disposed in the second housing.

Furthermore, the first wireless charging antenna may include a first center C1 which is the winding center of the first reception coil, the second wireless charging antenna may include a second center C2 which is the winding center of the second reception coil, and the distance D between the first center of the first wireless charging antenna and the second center of the second wireless charging antenna may be changed when the second housing slides with respect to the first housing.

Furthermore, the first wireless charging antenna and the second wireless charging antenna may form a concentric circle pattern when one surface (e.g., a surface facing the −Z direction with reference to FIG. 9B) of the electronic device is viewed in a first direction (e.g., the +Z direction with reference to FIG. 9B) while the display module 430 (e.g., the display module 160 in FIG. 1) of the electronic device is withdrawn from a receiving space 480 of the electronic device.

Various embodiments disclosed in the specification and the drawings are merely particular examples provided for easily describing the technical matters according to the embodiments disclosed herein and helping to understand the embodiments disclosed herein, and do not limit the scope of embodiments disclosed herein. Therefore, it should be construed that all modifications or modified forms capable of being derived from the technical idea of various embodiments of the disclosure in addition to the embodiments disclosed herein are included in the scope of various embodiments disclosed herein.

The invention claimed is:

1. An electronic device comprising:
a first housing;
a second housing movably coupled to the first housing;
a wireless charging antenna which comprises a shielding member and a reception coil alternately wound on a first surface of the shielding member and a second surface opposite to the first surface, the wireless charging antenna being disposed in at least one of the first housing and the second housing; and
a battery electrically connected to the wireless charging antenna,
wherein a first portion of the reception coil is disposed on the first surface of the shielding member, and
wherein a second portion of the reception coil is disposed on the second surface of the shielding member.

2. The electronic device of claim 1, wherein the reception coil of the wireless charging antenna is wound such that the first surface of the shielding member and the second surface of the shielding member have patterns substantially corresponding to each other.

3. The electronic device of claim 2, wherein the wireless charging antenna is disposed in at least one of the first housing and the second housing such that a winding center of the reception coil is adjacent to a center of the electronic device.

4. The electronic device of claim 1, wherein the wireless charging antenna comprises:
a first wireless charging antenna comprising a first shielding member and a first reception coil alternately wound on a first surface of the first shielding member and a second surface opposite to the first surface, the first wireless charging antenna being disposed in the first housing; and
a second wireless charging antenna comprising a second shielding member and a second reception coil configured to be alternately wound on a first surface of the second shielding member and a second surface opposite to the first surface, the second wireless charging antenna being disposed in the second housing.

5. The electronic device of claim 4, wherein the first wireless charging antenna comprises a first center which is a winding center of the first reception coil,
wherein the second wireless charging antenna comprises a second center which is a winding center of the second reception coil, and
wherein the first wireless charging antenna and the second wireless charging antenna are arranged such that at least one of the first center of the first reception coil and the second center of the second reception coil is adjacent to the center of the electronic device.

6. The electronic device of claim 4, further comprising:
a display module of which at least a portion is drawn into or withdrawn from a receiving space of the electronic device in accordance with the second housing with respect to the first housing,
wherein a distance between the first center of the first wireless charging antenna and the second center of the second wireless charging antenna is changed when the second housing slides with respect to the first housing.

7. The electronic device of claim 6, wherein the distance between the first center of the first wireless charging antenna and the second center of the second wireless charging antenna is shorter when the display module is withdrawn from the receiving space than when the display module is inserted into the receiving space.

8. The electronic device of claim 6, wherein the first wireless charging antenna and the second wireless charging antenna are arranged to form a concentric circle pattern when one surface of the electronic device is viewed in a first direction while the display module is withdrawn from the receiving space.

9. The electronic device of claim 6, wherein the second wireless charging antenna is positioned in a first direction with respect to the first wireless charging antenna while the display module is inserted into the receiving space, and
wherein the first wireless charging antenna at least partially overlaps the second wireless charging antenna when one surface of the electronic device is viewed in the first direction.

10. The electronic device of claim 9, wherein, in a state where the display module is inserted into the receiving space, a distance between the first center of the first wireless charging antenna and the second center of the electronic device is shorter than a distance between the second center of the second wireless charging antenna and the center of the electronic device.

11. The electronic device of claim 4, wherein the first housing and the second housing are foldably connected to each other.

12. The electronic device of claim 11, wherein the first wireless charging antenna and the second wireless charging antenna are arranged to form a concentric circle pattern when one surface of the electronic device is viewed in a first direction while the first housing and the second housing are unfolded.

13. The electronic device of claim 11, wherein the second wireless charging antenna is positioned in a first direction with respect to the first wireless charging antenna while the first housing and the second housing are folded, and wherein the first wireless charging antenna at least partially overlaps the second wireless charging antenna when one surface of the electronic device is viewed in the first direction.

14. The electronic device of claim 1, wherein an induced current is generated in the reception coil by an externally applied magnetic field, and wherein when one surface of the electronic device is viewed in a first direction, directions of induced currents flowing in a portion of the reception coil disposed on the first surface of the shielding member and a portion of the reception coil disposed on the second surface of the shielding member are opposite to each other.

15. The electronic device of claim 1, wherein the shielding member is configured to shield noise generated by electromagnetic force and/or operating frequency of the wireless charging antenna.

16. A wireless charging antenna included in an electronic device in which a first housing and a second housing are movably coupled to each other, the wireless charging antenna being disposed in at least one of the first housing and the second housing and comprising:

a shielding member; and a reception coil alternately wound on a first surface of the shielding member and a second surface opposite to the first surface, wherein a first portion of the reception coil is disposed on the first surface of the shielding member, and wherein a second portion of the reception coil is disposed on the second surface of the shielding member.

17. The wireless charging antenna of claim 16, wherein the reception coil of the wireless charging antenna is wound such that the first surface of the shielding member and the second surface of the shielding member have patterns substantially corresponding to each other.

18. The wireless charging antenna of claim 16, wherein the wireless charging antenna comprises:

a first wireless charging antenna comprising a first shielding member and a first reception coil configured to be alternately wound on a first surface of the first shielding member and a second surface opposite to the first surface, the first wireless charging antenna being disposed in the first housing; and a second wireless charging antenna comprising a second shielding member and a second reception coil configured to be alternately wound on a first surface of the second shielding member and a second surface opposite to the first surface, the second wireless charging antenna being disposed in the second housing.

19. The wireless charging antenna of claim 18, wherein the first wireless charging antenna comprises a first center which is a winding center of the first reception coil, wherein the second wireless charging antenna comprises a second center which is a winding center of the second reception coil, and wherein a distance between the first center of the first wireless charging antenna and the second center of the second wireless charging antenna is changed when the second housing slides with respect to the first housing.

20. The wireless charging antenna of claim 19, wherein the first wireless charging antenna and the second wireless charging antenna are arranged to form a concentric circle pattern when one surface of the electronic device is viewed in a first direction while a display module of the electronic device is withdrawn from a receiving space of the electronic device.

* * * * *